United States Patent
Hashimoto et al.

(10) Patent No.: US 12,224,387 B2
(45) Date of Patent: Feb. 11, 2025

(54) LIGHT EMITTING DEVICE

(71) Applicant: NICHIA CORPORATION, Anan (JP)

(72) Inventors: Takuya Hashimoto, Tokushima (JP); Soichiro Miura, Tokushima (JP)

(73) Assignee: NICHIA CORPORATION, Anan (JP)

( * ) Notice: Subject to any disclaimer, the term of this patent is extended or adjusted under 35 U.S.C. 154(b) by 455 days.

(21) Appl. No.: 17/556,530

(22) Filed: Dec. 20, 2021

(65) Prior Publication Data

US 2022/0209078 A1    Jun. 30, 2022

(30) Foreign Application Priority Data

Dec. 24, 2020 (JP) ................................ 2020-214851
Nov. 5, 2021 (JP) ................................ 2021-181461

(51) Int. Cl.
| | |
|---|---|
| *H01L 21/00* | (2006.01) |
| *H01L 25/16* | (2023.01) |
| *H01L 27/15* | (2006.01) |
| *H01L 33/58* | (2010.01) |
| *H01L 33/62* | (2010.01) |

(52) U.S. Cl.
CPC ............ *H01L 33/58* (2013.01); *H01L 25/167* (2013.01); *H01L 27/156* (2013.01); *H01L 33/62* (2013.01)

(58) Field of Classification Search
CPC ..... H01L 33/58; H01L 25/167; H01L 27/156; H01L 33/62
See application file for complete search history.

(56) References Cited

U.S. PATENT DOCUMENTS

| | | |
|---|---|---|
| 5,751,748 A | 5/1998 | Uejima et al. |
| 5,809,050 A | 9/1998 | Baldwin et al. |
| 5,835,514 A | 11/1998 | Yuen et al. |
| (Continued) | | |

FOREIGN PATENT DOCUMENTS

| | | |
|---|---|---|
| JP | S60-086887 A | 5/1985 |
| JP | H01-123493 A | 5/1989 |
| (Continued) | | |

OTHER PUBLICATIONS

Non-Final Office Action in U.S. Appl. No. 17/330,241 dated Apr. 25, 2023.
(Continued)

*Primary Examiner* — Richard A Booth
(74) *Attorney, Agent, or Firm* — Foley & Lardner LLP

(57) ABSTRACT

A light emitting device includes: a first light-emitting element; a second light-emitting element; a photodetector having a light-receiving surface at an upper face thereof, the light-receiving surface including: a first light-receiving region configured to receive a portion of light emitted from the first light-emitting element, and a second light-receiving region configured to receive a portion of light emitted from the second light-emitting element; and at least one lens member having: at least one incident surface on which a portion of the light emitted from the first light-emitting element and/or a portion of the light emitted from the second light-emitting element are incident, and at least one exiting surface through which the portion of the light incident on the incident surface is emitted. In a top view, the lens member is disposed so as to overlap the upper face of the photodetector in part or in whole.

16 Claims, 10 Drawing Sheets

(56) References Cited

U.S. PATENT DOCUMENTS

| | | |
|---|---|---|
| 6,252,252 B1 | 6/2001 | Kunii et al. |
| 6,438,075 B1 | 8/2002 | Takeda et al. |
| 6,587,481 B1 | 7/2003 | Seong et al. |
| 2003/0081637 A1 | 5/2003 | Short |
| 2004/0179774 A1 | 9/2004 | Delpiano et al. |
| 2005/0135219 A1 | 6/2005 | Oka |
| 2007/0002330 A1 | 1/2007 | Hill |
| 2007/0188864 A1 | 8/2007 | Duncan et al. |
| 2011/0116520 A1 | 5/2011 | Krijn et al. |
| 2011/0280267 A1 | 11/2011 | Yoshikawa et al. |
| 2015/0229108 A1 | 8/2015 | Steigerwald et al. |
| 2016/0277116 A1 | 9/2016 | Hasegawa et al. |
| 2016/0282174 A1 | 9/2016 | Hasegawa et al. |
| 2017/0207606 A1 | 7/2017 | Nakanishi |
| 2017/0315368 A1 | 11/2017 | Nakanishi |
| 2018/0017746 A1 | 1/2018 | Enya et al. |
| 2019/0334315 A1 | 10/2019 | Enya et al. |
| 2020/0220323 A1 | 7/2020 | Nakanishi |
| 2020/0286871 A1* | 9/2020 | Liff .................. H01L 27/14634 |
| 2021/0328412 A1 | 10/2021 | Hettler et al. |
| 2022/0209496 A1* | 6/2022 | Wang .................. H01S 5/0239 |
| 2022/0286871 A1* | 9/2022 | Zhang ................ H04W 72/046 |

FOREIGN PATENT DOCUMENTS

| | | |
|---|---|---|
| JP | H02-125687 A | 5/1990 |
| JP | H05-175614 A | 7/1993 |
| JP | H07-272337 A | 10/1995 |
| JP | H08-330661 A | 12/1996 |
| JP | H09-288838 A | 11/1997 |
| JP | 2000-004067 A | 1/2000 |
| JP | 2000-353332 A | 12/2000 |
| JP | 2001-068794 A | 3/2001 |
| JP | 2001-118281 A | 4/2001 |
| JP | 2002-202471 A | 7/2002 |
| JP | 2003-152263 A | 5/2003 |
| JP | 2003-332699 A | 11/2003 |
| JP | 2004-071591 A | 3/2004 |
| JP | 2005-010484 A | 1/2005 |
| JP | 2005-203074 A | 7/2005 |
| JP | 2007-047681 A | 2/2007 |
| JP | 2008-041918 A | 2/2008 |
| JP | 2009-244594 A | 10/2009 |
| JP | 2011-527518 A | 10/2011 |
| JP | 2011-249714 A | 12/2011 |
| JP | 2012-018992 A | 1/2012 |
| JP | 2012-163903 A | 8/2012 |
| JP | 2016-015415 A | 1/2016 |
| JP | 2016-096219 A | 5/2016 |
| JP | 2016-178218 A | 10/2016 |
| JP | 2016-181645 A | 10/2016 |
| JP | 2017-506824 A | 3/2017 |
| JP | 2018-010944 A | 1/2018 |
| JP | 2018-014351 A | 1/2018 |
| JP | 2018-022840 A | 2/2018 |
| JP | 2018-085422 A | 5/2018 |
| JP | 2018-085450 A | 5/2018 |
| JP | 2018-098256 A | 6/2018 |
| JP | 2020-016826 A | 1/2020 |
| JP | 2021-174991 A | 11/2021 |
| WO | WO-2010/004477 A2 | 1/2010 |
| WO | WO-2016/076105 A1 | 5/2016 |
| WO | WO-2018/105182 A1 | 6/2018 |
| WO | WO-2019/065162 A1 | 4/2019 |

OTHER PUBLICATIONS

Non-Final Office Action in U.S. Appl. No. 17/330,241, dated Oct. 5, 2023.

* cited by examiner

LIGHT EMITTING DEVICE

CROSS-REFERENCE TO RELATED APPLICATION

This application claims priority to Japanese Patent Application No. 2020-214851, filed on Dec. 24, 2020, and Japanese Patent Application No. 2021-181461, filed on Nov. 5, 2021, the disclosures of which are hereby incorporated by reference in their entireties.

BACKGROUND

The present disclosure relates to a light emitting device.

Optical units have been known in which a portion of light that is emitted from a light-emitting element is received with a photoelectric conversion element, and the resultant received light is utilized in performing optical control. For example, Japanese Patent Publication No. 2005-203074 discloses an optical head that includes a light source, a collimator lens to collimate light that is emitted from the light source, a holder holding the collimator lens, and a photodetector. In this optical head, light that is reflected from a reflection surface that is provided on the holder is incident on the photodetector. The resultant received light is used for applying feedback control to the output of the light source.

SUMMARY

According to certain embodiments of the present disclosure, a small-sized light emitting device that includes photodetector is provided.

In an illustrative and non-limiting embodiment of the present disclosure, a light emitting device comprises: a first light-emitting element, a second light-emitting element, a photodetector, and at least one lens member. The photodetector has a light-receiving surface provided on an upper face thereof. The light-receiving surface includes a first light-receiving region configured to receive a portion of light emitted from the first light-emitting element and a second light-receiving region configured to receive a portion of light emitted from the second light-emitting element. The at least one lens member includes at least one incident surface and at least one exiting surface. The at least one incident surface is a surface on which a portion of the light emitted from the first light-emitting element and/or a portion of the light emitted from the second light-emitting element are incident. The at least one exiting surface is a surface through which the portion of the light incident on the at least one incident surface is emitted. In a top view, the at least one lens member is disposed so as to overlap the upper face of the photodetector in part or in whole.

According to certain embodiments of the present disclosure, a small-sized light emitting device that includes a photodetector can be provided.

DETAILED DESCRIPTION

Figure 1:
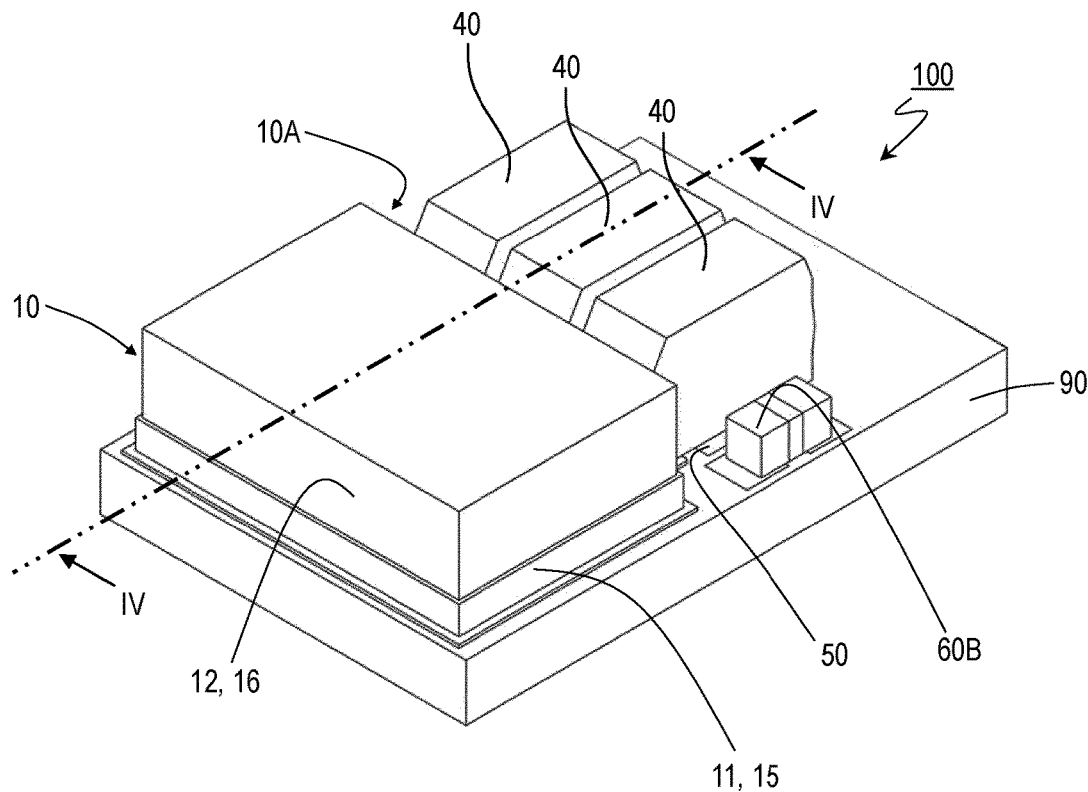
FIG. 1 is a perspective view of a light emitting device according to an embodiment of the present disclosure.

In the specification and claims herein, a polygonal shape, such as a triangle, quadrangle, or the like, is not limited to the polygonal shape in a mathematically strict sense, and includes any of those shapes subjected to processing such as cutting angles, chamfering, beveling, rounding, or the like. Similarly, a polygonal shape subjected to processing not only at a corner (end of a side), but also in any intermediate portion of a side will also be referred to as a polygonal shape. In other words, any polygon-based shape subjected to processing is included in a "polygon" disclosed in the specification and the claims herein.

This applies to not only polygons, but also any word that describes a specific shape, such as a trapezoidal, circular, recessed, or projected shape. This also applies when describing each side of a shape. In other words, even if a side is subjected to processing at a corner or at a portion between the corner, the "side" includes the processed portion. In the case of distinguishing a "polygon" or "side" that has not been processed from a processed shape, it will be expressed with the word "strict sense" added thereto, for example, a "strict sense quadrangle."

In the present specification and in the claims, the terms "perpendicular" and "parallel" have a tolerance within ±50.

In the specification and claims herein, moreover, when there are multiple pieces of a certain component and a distinction must be made, an ordinal such as "first," "second," or the like might occasionally be added. For example, a claim may recite that "a light emitting element is disposed on a substrate," while the specification may state that "a first light emitting element and a second light emitting element are disposed on a substrate." The ordinals, such as "first" and "second," are merely used to distinguish two light emitting elements. There is no special meaning associated with the order of the ordinals. An element accompanied by the same ordinal might not refer to the same element between the specification and the claims. For example, in the case in which elements are specified by the words, "a first light emitting element," "a second light emitting element," and "a third light emitting element," in the specification, "a first light emitting element" and "a second light emitting element" recited in the claims might correspond to "a first light emitting element" and "a third light emitting element" in the specification. Furthermore, in the case in which the term, "a first light emitting element," is used, but the term, "a second light emitting element," is not used in claim 1, the invention according to claim 1 is sufficient if it includes one light emitting element, and the light emitting element is not limited to "a first light emitting element" as used in the specification, i.e., it can be "a second light emitting element" or "a third light emitting element" in the specification.

In the specification and claims herein, terms indicating directions or positions (e.g., "upper/upward," "lower/downward," "right/rightward," "left/leftward," "front", "rear", and other terms including or related to these) might be used. These terms, however, are merely used for the purpose of making the relative directions or positions in the drawings being referenced more easily understood. As long as the relative relationship between the directions or the positions indicated with the terms such as "upper," "lower," or the like is the same as those in a referenced drawing, the absolute layout of the elements in drawings outside of the present disclosure, or actual products and manufacturing equipment outside of the present disclosure, does not have to be the same as that shown in the referenced drawing.

Note that the dimensions, dimensional ratio, shapes, interspace of arrangement, etc. of any component elements shown in a drawing may be exaggerated for ease of understanding. In order to avoid excessive complexity of the drawings, certain elements may be omitted from illustration.

Hereinafter, embodiments of the present invention will be described with reference to the drawings. Although the embodiments illustrate specific implementations of the technological concepts of the present invention, they do not limit the present invention. The numerical values, shapes, materials, steps, and the order of the steps shown in the description of the embodiments are only examples, and various modifications are possible so long as there is no technical contradiction. In the following description, elements identified by the same name or reference numerals are the same or the same type of elements, and redundant explanations of those elements may be omitted.

Figure 2:
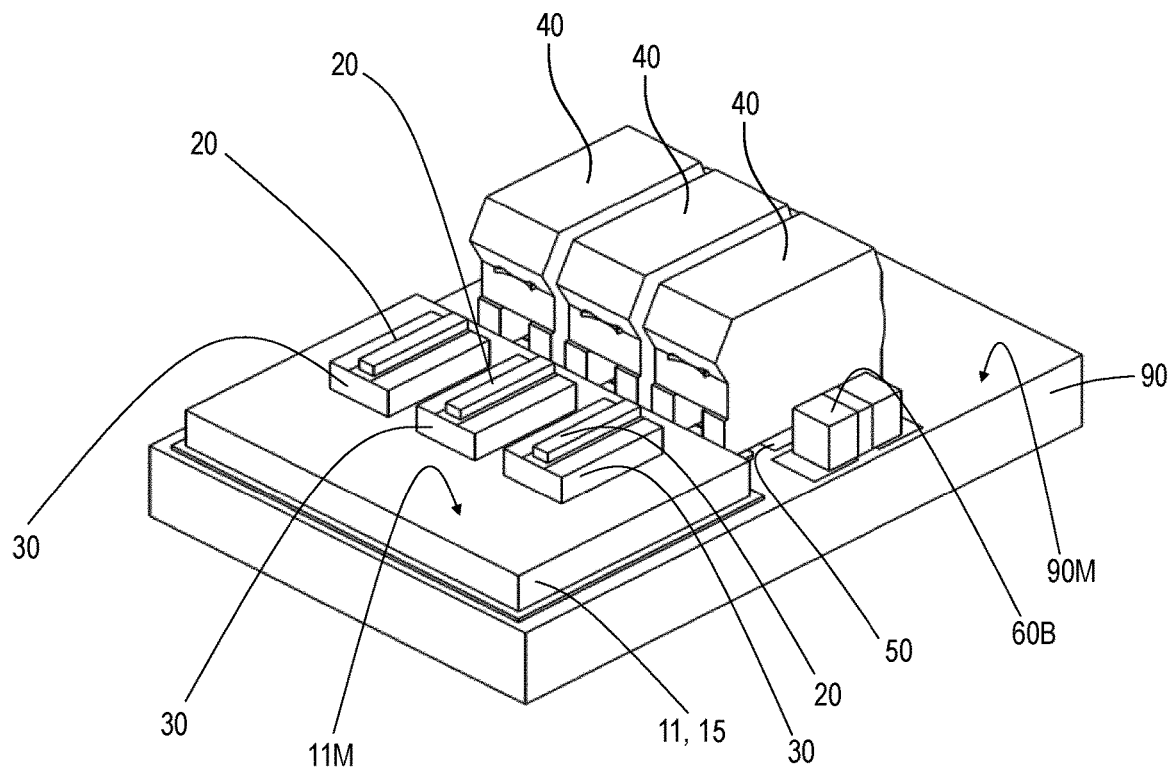
FIG. 2 is a perspective view of the light emitting device according to an embodiment of the present disclosure, from which a package is partly removed.
Figure 3:
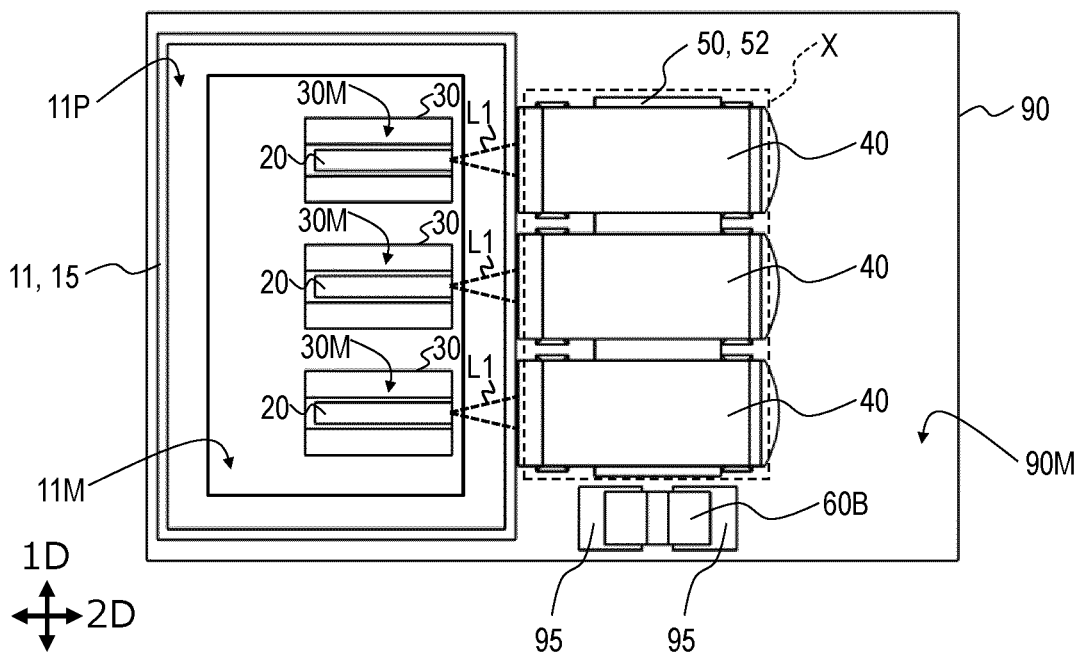
FIG. 3 is a top view of a light emitting device according to an embodiment of the present disclosure, from which a package is partly removed.
Figure 4:
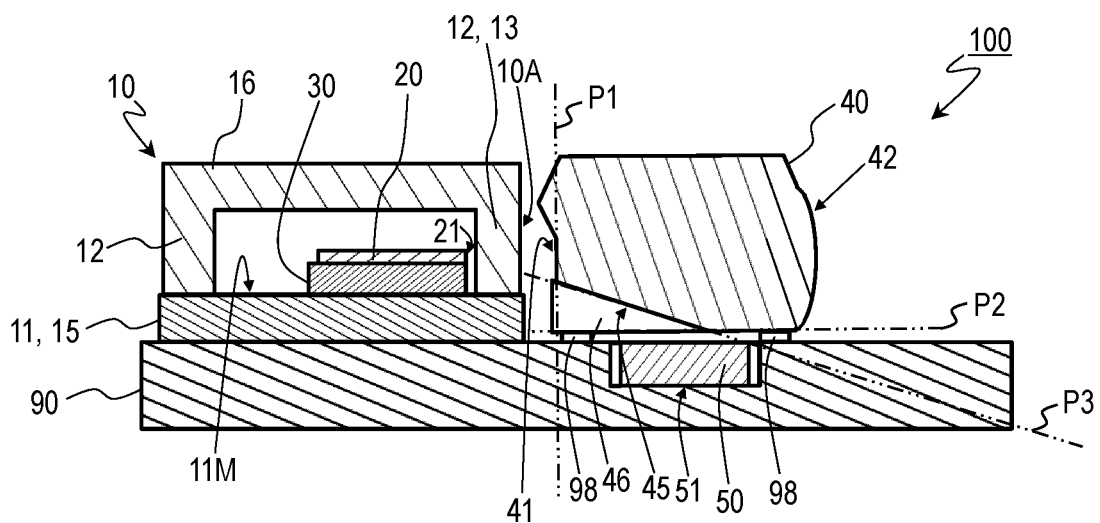
FIG. 4 is a cross-sectional view taken at line IV-IV in FIG. 1.
Figure 5:
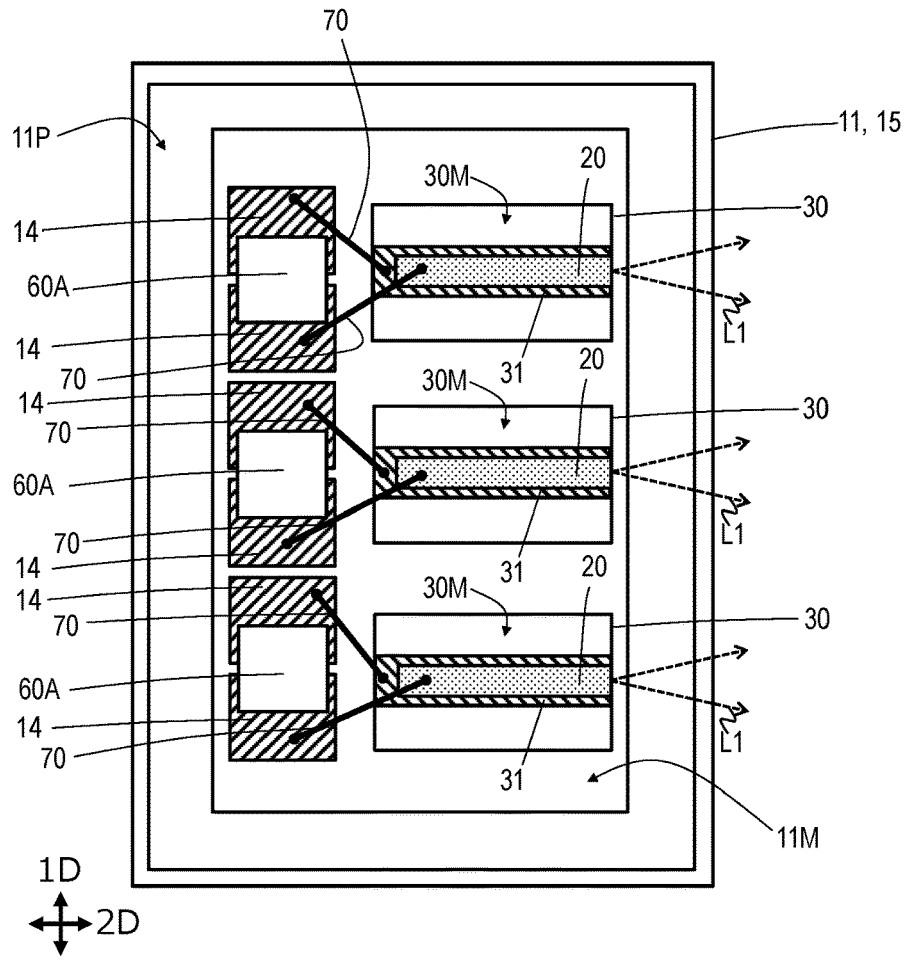
FIG. 5 is an enlarged top view showing example wiring inside the package.
Figure 6:
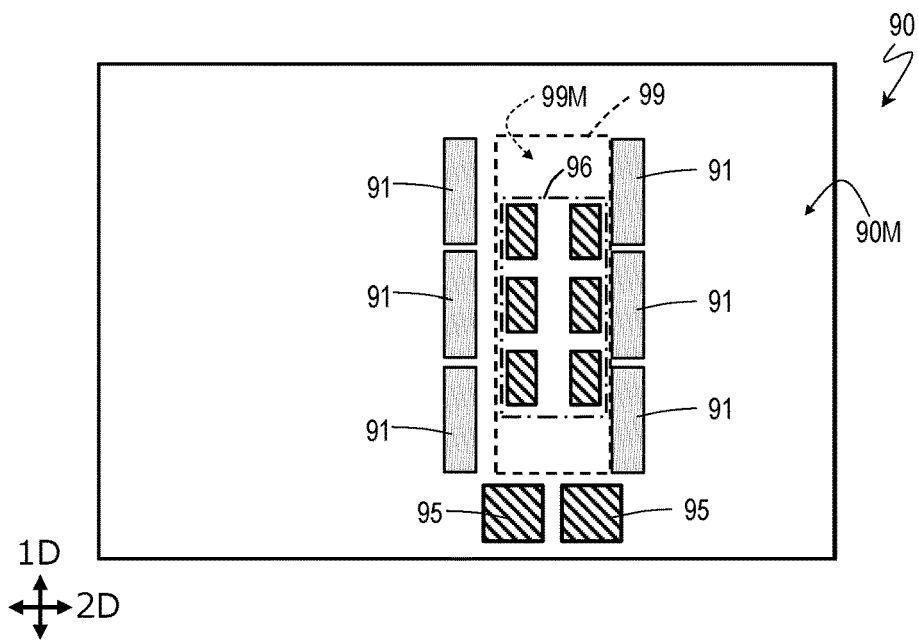
FIG. 6 is a top view of a second substrate.
Figure 7:
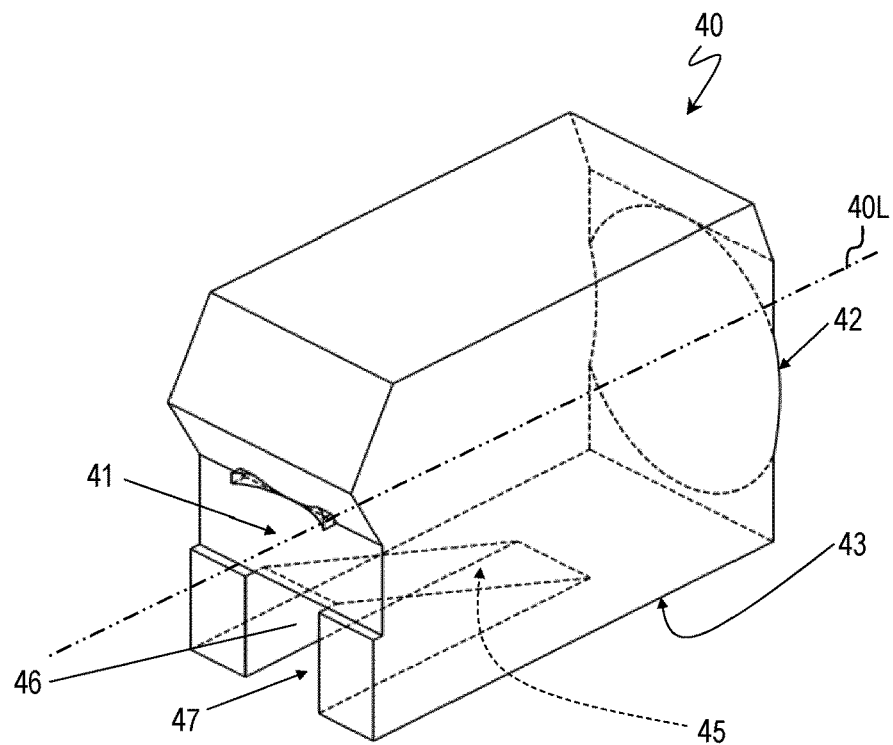
FIG. 7 is a perspective view of an optic element.
Figure 8:
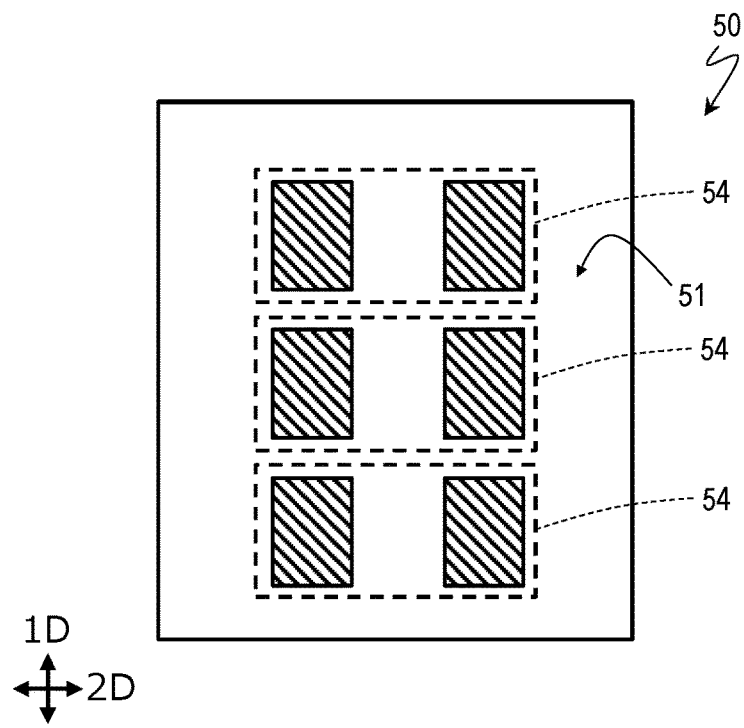
FIG. 8 is a top view of a bonding surface of a photodetector.
Figure 9:
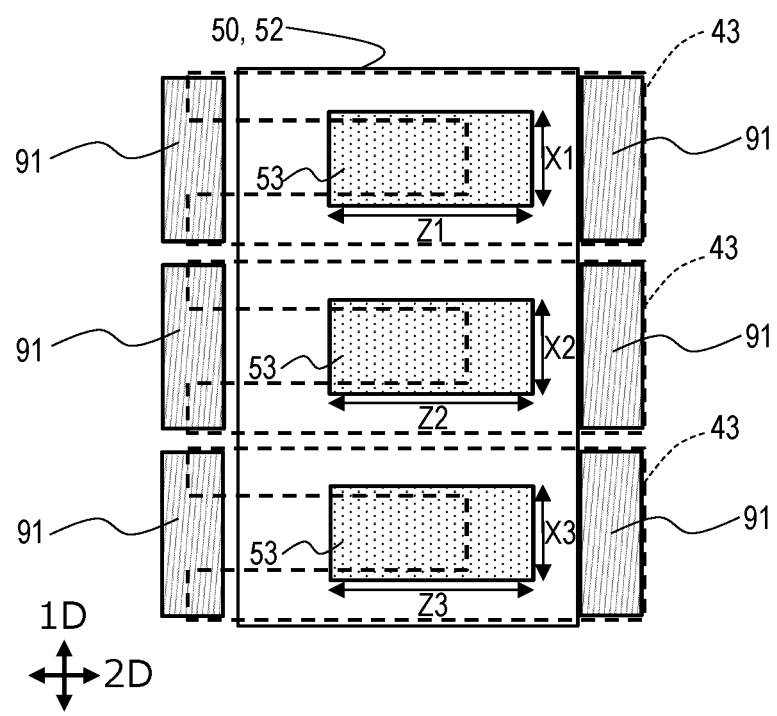
FIG. 9 is an enlarged top view of a portion X in FIG. 3.
Figure 10A:
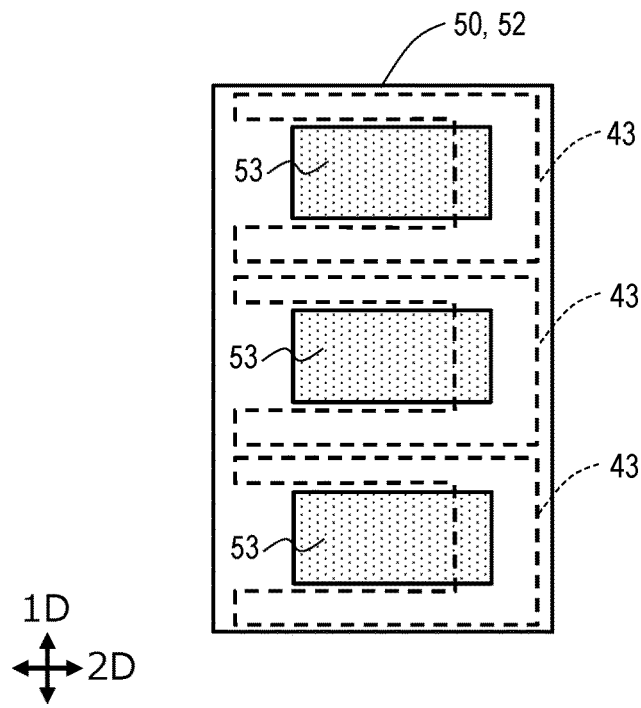
FIG. 10A is another enlarged top view of the portion X in FIG. 3.

A light emitting device 100 according to the present embodiment will be described. FIGS. 1 to 9, and 10A and 103 are diagrams showing an illustrative implementation of the light emitting device 100. FIG. 1 is a perspective view of the light emitting device 100 according to the present embodiment. FIG. 2 is a perspective view of the light emitting device 100 from which the package 10 is partly removed so as to reveal the structure inside the package. FIG. 3 is a top view drawn similarly to FIG. 2. FIG. 4 is a cross-sectional view taken at line IV-IV in FIG. 1. FIG. 5 is an enlarged top view showing example wiring inside the package 10. FIG. 6 is a top view of a second substrate 90. FIG. 7 is a perspective view of a lens member 40. FIG. 8 is a plan view of a bonding surface 51 of a photodetector 50. FIG. 9 is an enlarged view of a portion X in FIG. 3. FIG. 10A is another enlarged view of the portion X in FIG. 3. FIG. 103 is still another enlarged view of the portion X in FIG. 3.

For convenience of description, mutually-orthogonal arrows 1D and 2D within a two-dimensional plane are shown in the drawings; the directions indicated by these arrows will be referred to as the 1D direction and the 2D direction, respectively. Among any number of drawings directed to the same embodiment, it is ensured that 1D and 2D always indicate these same directions. In order to prevent the drawings from becoming overly complicated, the protection element 60A and any wirings inside the package 10 are omitted from illustration in FIG. 2, FIG. 3, and FIG. 4. The broken line in FIG. 3 showing the portion X is an imaginary line for convenience of explanation. In FIG. 3 and FIG. 5, a main portion of light that is emitted from each light-emitting element 20 are indicated by dotted lines. In FIG. 7, an optical axis 40L of a lens surface, which extends through the lens member 40, is indicated by a double-dot dashed line.

The light emitting device 100 according to the present embodiment includes multiple component elements, including: a package 10; one or more light-emitting elements 20, one or more submounts 30, one or more lens members 40, a photodetector 50, one or more protection elements 60A, a temperature measurement element 60B, and a substrate 90.

In the illustrated example of the light emitting device 100, three light-emitting elements 20 and three submounts 30 are disposed within the space inside the package 10. The lens members 40 and the photodetector 50 are disposed outside the package 10. Divergent light that is emitted from each of the three light-emitting elements 20 is emitted laterally from a light extraction face 10A of the package 10 to the outside, and thereafter collimated by the corresponding one of the three lens members 40.

First, each component element will be described.
(Package 10)

The package 10 includes: a base portion 11, which has a mounting surface 11M, and lateral wall portions 12 surrounding the mounting surface 11M. The mounting surface 11M of the base portion 11 is a region where other component elements are disposed. Moreover, the package 10 includes a substrate 15 and a cap 16 that is fixed to the substrate 15. The base portion 11 is included in the substrate 15, whereas the lateral wall portions 12 are included in the cap 16. In the following, the substrate 15 and the substrate 90 may be distinguished as the first substrate 15 and the second substrate 90, respectively.

In the illustrated example, the cap 16 includes: an upper-surface portion (lid) facing the mounting surface 11M via some other component elements disposed on the mounting surface 11M, and a lateral-surface portion (frame) surrounding the other component elements disposed on the mounting surface 11M. The lateral-surface portion of the cap 16 includes the lateral wall portions 12. Note, however, that the lateral wall portions 12 do not need to be part of the cap 16. For example, the package 10 may alternatively be composed of: one monolithic member including the base portion 11 and the lateral wall portions 12, and another member that includes the upper-surface portion.

In a top view of the mounting surface 11M of the base portion 11 as viewed from a normal direction thereof, the base portion 11 and the cap 16 both have a rectangular outer shape. Each of these outer shapes does not need to be rectangular, but may be any polygon other than a quadrangle, or any shape that includes a curve(s), a bend(s), or recesses and protrusions in a part or a whole thereof.

The base portion 11 includes one or more upper faces. The mounting surface 11M is included among the one or more upper faces of the base portion 11. The one or more upper faces of the base portion 11 include an upper face having a peripheral region 11P that surrounds one or more component elements disposed on the mounting surface 11M. In the illustrated example of the light emitting device 100, the peripheral region 11P is provided on the same upper face as the upper face having the mounting surface 11M. Note that the mounting surface 11M and the peripheral region 11P need not be in the same plane, and may constitute different upper faces that are higher or lower in level, for example.

The peripheral region 11P is a region to which the cap 16 is bonded. In a top view, the peripheral region 11P is provided between the outer shape of the base portion 11 and a mounting region of the mounting surface 11M (i.e., a region where the multiple component elements are to be disposed). In the illustrated example of the light emitting device 100, in a top view, the mounting region of the mounting surface 11M is approximately rectangular, and the peripheral region 11P presents an annular rectangular shape surrounding the mounting region. To an upper face of the peripheral region 11P, a lower face of the lateral-surface portion of the cap 16 is bonded. A metal film for bonding with the cap 16 may be disposed in the peripheral region 11P.

As is illustrated in FIG. 4, the package 10 includes a light-transmissive region 13, which is a region that is highly light-transmissive. Moreover, the package 10 has a light extraction face 10A, which includes the light-transmissive region 13. The light extraction face 10A is one face among the one or more outer side faces of the lateral wall portions 12 of the package 10. When it is said that a region is of "highly light-transmissive" nature, it is meant that the subject has a transmittance of 80% or more with respect to a main portion of light entering the region. For example, when the main portion of light is blue light, being "highly light-transmissive" can be defined as having a transmittance of 80% or more with respect to blue light; when the main portion of light is infrared light, being "highly light-transmissive" can be defined as having a transmittance of 80% or more with respect to infrared light.

At its one or more outer side faces, the package 10 may have a light-transmissive region other than the light-transmissive region 13. Moreover, the package 10 may partially include a non-light-transmissive region (or a region that is not highly light-transmissive). In the illustrated example, the package 10 has four outer lateral faces of a rectangle, all of which are light-transmissive, but there exists only one light extraction face 10A.

The cap 16 may be entirely formed of a light-transmissive material, or only its lateral portions may be formed of a light-transmissive material. One portion including the light extraction face 10A may be formed of a first light-transmissive material, while other portions may be formed of a second light-transmissive material or a non-light-transmissive material.

The cap 16 may be a monolithic piece composed of an upper portion and the lateral portions. For example, from a light-transmissive material such as glass, plastic, or quartz, a processing technique such as molding or etching may be utilized to produce a cap 16 having a desired shape, for example, a box shape. The cap 16 may be formed by bonding together an upper portion and lateral portions that were separately formed by using different materials as their respective main materials. For example, the main material of the upper-surface portion may be monocrystalline or polycrystalline silicon, while the main material of the lateral-surface portion may be glass.

In the illustrated example of the light emitting device 100, the light extraction face 10A is perpendicular to the directions in which the mounting surface 11M extends. Moreover, the light extraction face 10A does not need to be perpendicular to the directions in which the mounting surface 11M extends, but may be inclined therefrom.

Wiring regions 14 are provided on the mounting surface 11M. Through the interior of the base portion 11, the wiring regions 14 may be electrically connected to wiring regions provided on the lower face of the base portion 11. Without being limited to the lower face of the base portion 11, the wiring regions (to be electrically connected to the wiring regions 14) may be provided on any other external surface of the base portion 11 (e.g., an upper face or outer lateral faces) that is located outside of the mounting region of the mounting surface 11M. The wiring regions 14 may be a patterned film or layer that is formed of an electrical conductor, for example, a metal. The wiring regions 14 include multiple sets of wiring regions, where each set consists of two wiring regions constituting a pair. The two wiring regions constituting each set are electrically connected to one component element, and are utilized to receive power from outside of the package 10.

The base portion 11 may be formed of ceramic as a main material. Examples of ceramics to be used for the base portion 11 include aluminum nitride, silicon nitride, aluminum oxide, and silicon carbide. Moreover, the base portion 11 may be composed of a ceramic substrate that includes metal vias that allow the wiring regions 14 to be electrically connected to the wiring regions provided on the lower face of the base portion 11.

According to one example of the dimensions of the package 10, a height of the package 10 may be 2.5 mm or less, and, in a top view, one side of a rectangular outer shape of the package 10 may have a length of 8 mm or less. According to an alternative example of the dimensions of the package 10, a height of the package 10 may be 2 mm or less, and, in a top view, one side of a rectangular outer shape of the package 10 may have a length of 4 mm or less.

(Light-Emitting Element 20)

The light-emitting element 20 emits light from a light-exiting surface 21. An example of a light-emitting element 20 is a semiconductor laser element. The light-emitting element 20 may have a rectangular outer shape in a top view. In the case in which the light-emitting element 20 is an edge-emitting type semiconductor laser element, a lateral face that includes one of the two shorter sides of the rectangle in a top view defines an emission end face through which light is emitted, and is the light-exiting surface 21. In this example, an upper face and a lower face of the light-emitting element 20 each have a greater area than that of the light-exiting surface 21. Without being limited to an edge-emitting type semiconductor laser element, the light-emitting element 20 may be a surface-emitting type semiconductor laser element, or a light-emitting diode (LED).

The light-emitting element 20 is a single-emitter (i.e., having one emitter). Note that the light-emitting element 20 may be a multi-emitter (i.e., having two or more emitters). The light that is emitted from the light-exiting surface 21 of the light-emitting element 20 is divergent light having some spread. Alternatively, the light need not be divergent light.

In the case in which the light-emitting element 20 is a semiconductor laser element, the light (laser light) that is emitted from the semiconductor laser element creates a far field pattern (hereinafter referred to as "FFP") of an elliptical shape at a face that is parallel to the light-exiting surface 21. An FFP refers to the shape, or optical intensity distribution, of exiting light at a position away from the light-exiting surface. In the case of a light-emitting element 20 having multiple emitters, light having an FFP of an elliptical shape is emitted from each emitter.

Light that passes through the center of the elliptical shape of an FFP, i.e., light having a peak intensity in the optical intensity distribution of the FFP, will be referred to as "light traveling on an optical axis" or "light traveling through an optical axis". Moreover, the optical path of light traveling on an optical axis will be referred to as "the optical axis" of that light.

Based on the optical intensity distribution of an FFP, light of an intensity that accounts for a predetermined intensity ratio or greater with respect to the peak intensity value may be referred to as the "main portion" of light, whereas light of an intensity that accounts for less than the predetermined intensity ratio may be referred to as "non-main portions" of light. Note that the predetermined intensity ratio is greater than 0% but not greater than 50%. For example, the predetermined intensity ratio may be 50%. Alternatively, the predetermined intensity ratio may be $1/e^2$, for example.

In the elliptical shape of an FFP of light that is emitted from the light-emitting element 20 being a semiconductor laser element, the minor axis direction of the ellipse will be referred to as the slow-axis direction, and its major axis direction will be referred to as the fast-axis direction. The plurality of layers that compose the semiconductor laser element (including an active layer) are layered in the fast-axis direction. Based on the optical intensity distribution of an FFP, an angle corresponding to the full width at half maximum or $1/e^2$ of the optical intensity distribution is defined as an angle of spread of the light from the semiconductor laser element.

As the light-emitting element 20, for example, a semiconductor laser element emitting blue light, a semiconductor laser element emitting green light, a semiconductor laser element emitting red light, or the like may be adopted. Semiconductor laser elements emitting any other colors of light may also be used.

Herein, "blue light" refers to light that falls within an emission peak wavelength range from 420 nm to 494 nm. "Green light" refers to light that falls within an emission peak wavelength range from 495 nm to 570 nm. "Red light" refers to light that falls within an emission peak wavelength range from 605 nm to 750 nm.

Examples of semiconductor laser element emitting blue light or semiconductor laser elements emitting green light may be semiconductor laser elements containing a nitride semiconductor. As the nitride semiconductor, for example, GaN, InGaN, or AlGaN may be used. Examples of semiconductor laser elements emitting red light may be those containing an InAlGaP-based, GaInP-based, GaAs-based, or AlGaAs-based semiconductor.

(Submount 30)

The submount 30 has two bonding surfaces, and is shaped as a rectangular solid. At the opposite side to one bonding surface, the other bonding surface is provided. The two bonding surfaces are an upper face 30M and a lower face of the submount 30, respectively. The distance between these two bonding surfaces is shorter than the distance between the other pair of two opposing surfaces. The shape of the submount 30 is not limited to a rectangular solid. The submount 30 may be formed of silicon nitride, aluminum nitride, or silicon carbide. A metal film for bonding purposes is provided on the lower face of the submount 30. Meanwhile, on the upper face 30M of the submount 30, wiring regions 31 to be electrically connected to other component elements are provided.

(Lens Member 40)

The lens member 40 has an incident surface 41 and an exiting surface 42 through which the light that is incident on the incident surface 41 exits. A lens surface(s) may be formed on the incident surface 41 and/or the exiting surface 42 of the lens member 40. In the example shown in FIG. 7, the lens member 40 has a planar incident surface 41 and an exiting surface 42 that presents a lens surface. The lens member 40 is formed in such a shape that light incident thereon is collimated by it before the light is emitted therefrom. Note that the shape of the lens member 40 shown in FIG. 7 is only exemplary, and the lens member according to the present disclosure is not limited to this shape. The shape of the lens member may be determined while paying attention to processing ease and the like, for example.

On the incident surface 41 and/or the exiting surface 42 of the lens member 40, an optical film such as an antireflection coating or an protective film may be provided. Multiple lens surfaces may be provided on the lens member 40.

The lens member 40 may be formed of a light-transmissive material, for example, glass or plastic. Although the portion of the lens member 40 through which light is not transmitted may have any arbitrary shape, it preferably has a shape that allows the lens member 40 to be fixed to other component elements. In the exemplary lens member 40 shown in FIG. 7, the lens member 40 has a lower face 43 that includes a flat region. The optical axis 40L of the lens surface of the lens member 40 is parallel to the lower face 43. The lower face 43 of the lens member 40 can serve as a bonding region.

Now, with reference to FIG. 4, three imaginary planes P1, P2 and P3 will be defined. In FIG. 4, the three planes P1, P2 and P3 are indicated by double-dot dashed lines. The first plane P1 is defined by a plane that includes the incident surface 41 of the lens member 40 and that is parallel thereto. The second plane P2 is defined by a plane that includes the lower face 43 of the lens member 40 and that is parallel thereto. The third plane P3 is defined by a plane that includes an incidence-avoiding surface(s) 45 of the lens member 40 and that is parallel thereto.

The lens member 40 may have one or more incidence-avoiding surfaces 45. The incidence-avoiding surface(s) 45 is formed above the lower face 43. The incidence-avoiding surface(s) 45 is formed on the exiting surface 42 side relative to the incident surface 41. Note that the incidence-avoiding surface(s) 45 may be formed so as to extend from the exiting surface 42 side relative to the incident surface 41, over to the side opposite to the exiting surface 42 side relative to the incident surface 41. The incidence-avoiding surface(s) 45 meets two lateral faces that meet the lower face 43 and that extend above.

The lens member 40 preferably includes a bonding surface for allowing it to be fixed to some other member. In the exemplary lens member 40 shown in FIG. 7, the lower face 43 serves as the bonding surface. Note that any face other than the lower face 43 may serve as the bonding surface instead.

FIG. 7 shows an example where the lens member 40 has a single incidence-avoiding surface 45. Incidentally, FIG. 12 (described in detail later) shows an example where the lens member 40 includes a plurality of incidence-avoiding surfaces 45. In the exemplary lens member 40 shown in FIG. 7, the incidence-avoiding surface 45 is formed so as to meet the incident surface 41 and continue from the incident surface 41, obliquely with respect to the incident surface 41. Moreover, the incidence-avoiding surface 45 meeting the incident surface 41 is tilted by a predetermined angle from the optical axis 40L of the lens surface or the lower face 43. The incidence-avoiding surface 45 also meets the lower face 43. In a cross-sectional view at a plane that passes through the optical axis 40L of the lens surface and that is perpendicular to the second plane P (as in the cross-sectional view of FIG. 4, for example), the clockwise range of tilt angles from the second plane P2 may be, for example, not less than 20° and not more than 30°.

In the lens member 40, an incidence-avoiding space 46 is defined. As shown in FIG. 4, the incidence-avoiding space 46 is a space that is surrounded by the first plane P1, the second plane P2, and the incidence-avoiding surface(s) 45. Furthermore, the incidence-avoiding space 46 is a space that is surrounded by the two opposing lateral faces each meeting the incidence-avoiding surface(s) 45. In the illustrated example of the light emitting device 100, the incidence-avoiding space 46 has a wedge shape. However, the shape of the incidence-avoiding space 46 is not limited thereto. In the illustrated example of the light emitting device 100, the lower face 43 has a U shape. However, the shape of the lower face 43 is not limited thereto.

The incidence-avoiding surface(s) 45 may locally have a reflection surface. Preferably, the reflection surface has a reflectance that accounts for, for example, 99% or more with respect to the peak wavelength of light incident on the incidence-avoiding surface(s) 45, and preferably is near 100%.

(Photodetector 50)

The photodetector 50 has the bonding surface 51, a light-receiving surface 52, and one or more lateral faces. The face that is at the opposite side to the light-receiving surface 52 serves as the bonding surface 51. However, the position of the bonding surface 51 is not limited thereto. The upper face of the photodetector 50 serves as the light-receiving surface 52. The outer shape of the photodetector 50 is illustrated as a rectangular solid; instead, its outer shape may be any shape other than a rectangular solid.

One or more light-receiving regions 53 are provided on the light-receiving surface 52. On the light-receiving surface 52, a plurality of light-receiving regions 53 that are electrically isolated from one another may be provided. Each of the one or more light-receiving regions 53 is a light-receiving surface of a photoelectric conversion element that outputs an electrical signal in accordance with the intensity or amount of incident light. A typical example of such a photoelectric conversion element is a photodiode.

In the illustrated example of the photodetector 50, a plurality of light-receiving regions 53 are provided on the light-receiving surface 52. Specifically, three light-receiving regions 53 are provided on the light-receiving surface 52. However, the number of light-receiving regions 53 is not limited to three. The plurality of light-receiving regions 53 are disposed with predetermined interspaces between one another. The plurality of light-receiving regions 53 are arranged along the 1D direction. In other words, the 1D direction may be regarded as the direction along which the plurality of light-receiving regions 53 are arranged upon the light-receiving surface 52.

An example of the outer shape of the light-receiving surface 52 is rectangular. In the illustrated example of the photodetector 50, the length of the entire light-receiving surface 52 along the 2D direction is shorter than its length along the 1D direction. However, the lengths of the light-receiving surface 52 of the photodetector 50 along the first direction and along the second direction may be equal. Alternatively, the length of the light-receiving surface 52 along the second direction may be longer than its length along the first direction.

Each light-receiving region 53 has a rectangular outer shape on the light-receiving surface 52. Without being limited to a rectangular shape, the shape of the light-receiving region 53 may be appropriately designed in accordance with the shape of light that is incident on the light-receiving surface 52. In the illustrated example of the photodetector 50, each light-receiving region 53 has a rectangular outer shape. Two sides of the four sides of the rectangle (i.e., shorter sides in the case of a non-square rectangle) are parallel to the 1D direction, while the other two sides (i.e., longer sides in the case of a non-square rectangle) are parallel to the 2D direction.

Each of the plurality of light-receiving regions 53 has a longer length ($Z1$, $Z2$, $Z3$) along the second direction than its length ($X1$, $X2$, $X3$) along the first direction. In the illustrated example of the photodetector 50, the plurality of light-receiving regions 53 are depicted as being identical in size (in terms of shape and size); however, they need not be identical in size.

As illustrated in FIG. 8, the photodetector 50 has one or more wiring regions 54. In the illustrated example, the one or more wiring regions 54 are provided on the bonding surface 51. Note that the one or more wiring regions 54 may alternatively be provided on any face other than the bonding surface 51, for example, a lateral face(s). Each wiring region 54 is electrically connected to the corresponding light-receiving region 53. Each wiring region 54 may be a patterned film or layer that is formed of a metal or other electrical conductors. The photodetector 50 may be electrically connected to an external circuit via wiring regions 54 provided on the bonding surface 51.

(Protection Element 60A)

The protection elements 60A are circuit elements to prevent certain devices (e.g., a light-emitting element 20) from being broken by an excessive current flowing into it. A typical example of a protection element 60A is a voltage regulating diode such as a Zener diode. As a Zener diode, an Si diode may be adopted.

(Temperature Measurement Element 60B)

The temperature measurement element 60B is a device used as a temperature sensor for measuring the surrounding temperature. An example of the temperature measurement element 60B is a thermistor.

(Wiring 70)

Each wiring 70 is formed of an electrical conductor having a linear shape, both ends of which serve as bonding sites. In other words, the wiring 70 has, at both ends of its linear body, bonding sites for bonding to other component elements. The wiring 70 may be a metal wire, for example. Examples of metals include gold, aluminum, silver, and copper.

(Second Substrate 90)

The second substrate 90 is structured so as to support the component elements of the light emitting device 100, and to be capable of electrically connecting with electronic parts included in such component elements. The second substrate 90 may also support any elements, electronic parts, or optical parts other than the component elements of the light emitting device 100.

As illustrated in FIG. 6, the second substrate 90 has a plurality of bonding regions 91. In each bonding region 91, a metal film for bonding to another component element may be formed. Moreover, one or more wiring regions 95 for electrically connecting to another component element(s) may be formed on the upper face of the second substrate 90. For example, through the interior of the second substrate 90, the wiring region(s) 95 may be electrically connected to a wiring region(s) provided on the lower face of the second substrate 90. Note that further bonding regions or wiring regions may be provided on the upper face of the second substrate 90.

The second substrate 90 can be formed by using a ceramic as a main material. Examples of ceramics to be used for the second substrate 90 include aluminum nitride, silicon nitride, aluminum oxide, and silicon carbide.

The second substrate 90 may have a recess 99 that has a bottom face 99M. The recess 99 can accommodate another component element(s). The other component element(s) may be mounted on the bottom face 99M. The recess 99 has a rectangular shape in a top view, so as to fit the outer shape of the other component element(s). There is a step difference between the mounting surface 90M of the second substrate 90 and the bottom face 99M of the recess 99, such that the bottom face 99M is located below the mounting surface 90M along the thickness direction of the substrate. Moreover, wiring regions 96 for electrically connecting to the other component element(s) are provided on the bottom face 99M. For example, similarly to the wiring region(s) 95, the wiring regions 96 may be electrically connected to wiring regions that are provided on the lower face of the second substrate 90, through the interior of the second substrate 90. Each wiring region 96 may be a patterned film or layer that is formed of a metal or other electrical conductors.

In the illustrated example of the second substrate 90, a plurality of bonding regions 91 are provided on regions on both sides of the recess 99 formed in the mounting surface 90M of the second substrate 90. A plurality of bonding regions 91 are disposed in one of the regions on both sides, with interspaces between one another; and a plurality of bonding regions 91 are disposed also in the other region, with interspaces between one another. However, instead of providing a plurality of bonding regions 91 in each of the regions on both sides, one bonding region 91 may be disposed.

(Light Emitting Device 100)

Next, the light emitting device 100 will be described.

In the light emitting device 100, the one or more light-emitting elements 20 are disposed inside the package 10. The one or more light-emitting elements 20 are disposed on the mounting surface 11M of the first substrate 15, and are surrounded by the lateral wall portions 12 of the package 10. In the illustrated example of the light emitting device 100, a plurality of light-emitting elements 20 are provided inside the package 10.

The one or more light-emitting elements 20 are disposed on the mounting surface 11M via the one or more submounts 30. Each light-emitting element 20 is disposed on the mounting surface 11M via a submount 30. The one or more submounts 30 are disposed inside the package 10. One light-emitting element 20 may be disposed on one submount 30, or multiple light-emitting elements 20 may be disposed on one submount 30. Alternatively, each light-emitting element 20 may be disposed on the mounting surface 11M not via a submount 30. Utilizing the submount 30 makes it possible to increase the height from the mounting surface 11M to the light emission point of the light-emitting element 20.

The illustrated light emitting device 100 includes three light-emitting elements 20. The three light-emitting elements 20 emit red light, green light, and blue light, respectively. However, the number of light-emitting elements 20 included in the light emitting device 100 is not limited to three, but may be two, or four or more. Each of the three light-emitting elements 20 is a semiconductor laser element. In the illustrated light emitting device 100, a light-emitting element 20 emitting green light is placed in the center, and a light-emitting element 20 emitting red light and a light-emitting element 20 emitting blue light are placed on both sides of this light-emitting element 20. However, the order of the three colors of RGB is not limited to this arrangement.

For convenience of description, among the plurality of light-emitting elements 20, two light-emitting elements 20 will be denoted as a first light-emitting element 20 and a second light-emitting element 20. Similarly, three light-emitting elements 20 will be denoted as a first light-emitting element 20, a second light-emitting element 20, and a third light-emitting element 20. In the illustrated example of the light emitting device 100, the light-emitting element 20 disposed in the center will be denoted as the first light-emitting element 20, whereas the two light-emitting elements 20 disposed on both sides of the first light-emitting element 20 will be respectively denoted as the second light-emitting element 20 and the third light-emitting element 20.

In the illustrated example of the light emitting device 100, the plurality of light-emitting elements 20 are arranged side by side. Specifically, the plurality of light-emitting elements 20 are arranged along the 1D direction. The plurality of light-emitting elements 20 each emit light that travels from the light-exiting surface in the 2D direction. The light traveling in the 2D direction may be light traveling on the optical axis of light emitted from the light-emitting element 20, for example. The plurality of submounts 30 are disposed along the 1D direction with interspaces between one another. Each submount 30 is bonded to a light-emitting element 20 on the upper face 30M, which is one of its bonding surfaces. Its bonding surface on the opposite side, i.e., the lower face, is bonded to the mounting surface 11M of the first substrate 15.

Each light-emitting element 20 is disposed so that its light-exiting surface 21 faces the light extraction face 10A of the package 10. In the illustrated example of the light emitting device 100, in a top view, light emission points of the plurality of light-emitting elements 20 are located on a single straight line that is parallel to the first direction. The interspace between the light emission points of two adjacent light-emitting elements 20 may be adjusted to, for example, not less than 200 μm and not more than 3000 μm.

In the example wiring shown in FIG. 5, on the rear face side of the light-emitting element 20, which is at the opposite side to the light-exiting surface 21, the plurality of wiring regions 14 are provided in a region between the peripheral region 11P and the region where the plurality of light-emitting elements 20 are disposed. The plurality of wiring regions 14 include three pairs of wiring regions 14. The three pairs of wiring regions 14 are arranged along the first direction.

In the light emitting device 100, the one or more protection elements 60A are disposed inside the package 10. Each protection element 60A is disposed on the mounting surface 11M of the first substrate 15. However, at least one protection element 60A may be disposed outside the package 10. The protection element(s) 60A is provided in order to protect the light-emitting elements 20. In the light emitting device 100, one protection element 60A is provided for one light-emitting element 20. In other words, there are as many protection elements 60A as are the light-emitting elements 20.

In the example wiring shown in FIG. 5, the plurality of protection elements 60A include three protection elements 60A corresponding to the three light-emitting elements 20. The three protection elements 60A are disposed on the mounting surface 11M of the first substrate 15. One protection element 60A is mounted in the pair of wiring regions 14 associated with one light-emitting element 20. More specifically, each protection element 60A is disposed on the corresponding wiring region 14, astride the pair of wiring regions 14.

One of a p-side electrode and an n-side electrode of each light-emitting element 20 is electrically connected to a wiring region 31 provided on the upper face 30M of the submount 30. One end of a wiring 70 is bonded to the wiring region 31, while the other end of this wiring 70 is bonded to one of a pair of wiring regions 14 provided on the mounting surface 11M of the first substrate 15. One end of another wiring 70 is bonded to the other one of the p-side electrode and n-side electrode of the light-emitting element 20, while the other end of this other wiring 70 is bonded to the other one of the pair of wiring regions 14 provided on the mounting surface 11M.

In a top view, between two imaginary planes including two lateral faces of the submount 30 that make a pair along the first direction, a protection element 60A for protecting the light-emitting element 20 disposed on this submount 30 is disposed. Moreover, bonding sites (at which the wirings 70 associated with the light-emitting element 20 disposed on at least one among any two adjacent submounts 30 along the first direction are bonded to the corresponding wiring regions 14) are provided between two imaginary planes including the facing two lateral faces between these two submounts 30. The length of the light emitting device 100 along the first direction 1D can be reduced by thus connecting the protection elements 60A and the wirings 70 to the wiring regions 14.

The one or more light-emitting elements 20 each emit light laterally from the package 10. From the light-exiting surface 21, each light-emitting element 20 emits divergent light in a direction of the light extraction face 10A. The light emitted from the light-exiting surface 21, traveling on its optical axis, proceeds in parallel to the mounting surface 11M. The light emitted from each light-emitting element 20 and transmitted through the light-transmissive region 13 of the lateral wall portion 12 of the package 10 is emitted laterally from the light extraction face 10A.

The package 10 emits one or more beams of divergent light through the light extraction face 10A. The optical axis of each light beam that is emitted from the light extraction face 10A is parallel to the 2D direction. The optical axis of each light beam that is emitted from the light extraction face 10A is perpendicular to the light extraction face 10A. The one or more beams of divergent light emitted from the light extraction face 10A are, respectively, light beams emitted from different ones among the one or more light-emitting elements 20. Note that divergent light creates a greater irradiated region as it travels farther. Therefore, the irradiated region of a divergent light beam may be regarded separately as: a central portion, and a peripheral portion surrounding the central portion. For example, the central portion of a divergent light beam may be the region that is irradiated with the main portion of light, whereas the peripheral portion of the divergent light beam may be the region that is irradiated with non-main portions of light.

In the illustrated example of the light emitting device 100, in the irradiated regions created on the light extraction face 10A by the plurality of divergent light beams emitted from the light extraction face 10A, their central portions do not overlap one another. This condition is also satisfied when each central portion is defined by a region irradiated with a main portion of light based on a predetermined intensity ratio of $1/e^2$. Thus, it can be said that this condition is satisfied at least in a range where the predetermined intensity ratio is not less than $1/e^2$ and not more than 50%.

In the light emitting device 100, a closed space is sealed inside the package 10. By bonding the first substrate 15 and the cap 16 in a predetermined ambient, a hermetically-sealed closed space is created inside the package 10. By hermetically sealing the space in which the light-emitting elements 20 are disposed, deteriorations in quality due to collection of dust can be restrained.

In the light emitting device 100, the package 10 is mounted on the second substrate 90. Specifically, the first substrate 15 of the package 10 is mounted on the second substrate 90. Via the wiring regions 14 of the first substrate 15 and the wiring regions 95 of the second substrate 90, various electronic parts disposed on the mounting surface 11M of the first substrate 15 may be electrically connected to circuitry outside the light emitting device 100.

In the light emitting device 100, the photodetector 50 is disposed on the second substrate 90. The photodetector 50 is disposed outside the package 10. Lateral to the light extraction face 10A, the photodetector 50 is disposed so that its light-receiving surface 52 faces upward. The photodetector 50 receives a part of the divergent light that is emitted laterally from the light extraction face 10A. The photodetector 50 receives a peripheral portion of light. Within the divergent light, the photodetector 50 receives light traveling downward.

The light-receiving surface 52 is disposed below an imaginary plane that is parallel to the mounting surface 11M, the imaginary plane including light that travels in a parallel direction to the mounting surface 11M within the divergent light emitted from the light extraction face 10A. The light-receiving surface 52 is disposed below an imaginary plane including the mounting surface 11M. The light-receiving surface 52 is disposed below an imaginary plane including the lower face of the package 10. The light-receiving surface 52 may be provided on an imaginary plane including the mounting surface 90M, or below this plane. This allows the light traveling downward from the light extraction face 10A to be received at the light-receiving surface 52. Note that the light-receiving surface 52 may be disposed above the imaginary plane including the lower face of the package 10 (see, for example, the embodiment illustrated in FIG. 13, described later).

The photodetector 50 is accommodated in the recess 99 made in the second substrate 90. By disposing the photodetector 50 so as to be accommodated in the recess 99, the light-receiving surface 52 can be placed in a low position. This makes it easier to provide a sufficient height from the light-receiving surface 52 to the light emission point of each light-emitting element 20. This allows the divergent light to be received at the light-receiving surface 52 easily.

In a state in which the photodetector 50 is accommodated in the recess 99, the one or more wiring regions 96 provided on the bottom face 99M of the recess 99 electrically couple to the one or more wiring regions 54 provided on the bonding surface 51 of the photodetector 50. This makes it unnecessary to provide any wiring regions 96 around the photodetector 50 on the mounting surface 90M of the second substrate 90, thereby contributing to reduce the size of the light emitting device 100. The one or more light-receiving regions 53 receive the one or more beams of divergent light emitted from the light extraction face 10A. The light-receiving regions 53 receive respectively different divergent light beams. One or more light-receiving regions 53 are provided on the light-receiving surface 52 in a one-to-one correspondence with the one or more light-emitting elements 20. In a top view, each light-receiving region 53 is provided so that the optical axis of the divergent light passes through a light-receiving region 53 receiving a portion of this divergent light.

The light emitting device 100 includes at least one photodetector 50. For example, the light emitting device 100 may include a plurality of photodetectors 50, thus resulting in a corresponding plurality of light-receiving regions 53. For example, one photodetector 50 may have a light-receiving region 53 for one divergent light beam. The one or more photodetectors 50 included in the light emitting device 100 may have one or more light-receiving surfaces and may be structured so as to have a plurality of light-receiving regions 53.

In the light emitting device 100, the one or more lens members 40 are disposed on the second substrate 90. The lower face 43 of each lens member 40 is bonded to the mounting surface 90M of the second substrate 90. Each lens member 40 is disposed lateral to the light extraction face 10A. The one or more lens members 40 are disposed so that the incident surface 41 thereof faces the light extraction face 10A of the package 10. The optical axes 40L of the lens surfaces of the one or more lens members 40 are perpendicular to the light extraction face 10A. The incident surfaces 41 of the one or more lens members 40 receive light beams traveling through optical axes of the respective one or more light-emitting elements 20. Note that the optical axis 40L of each lens surface may not necessarily be perpendicular to the light extraction face 10A.

The distance from the light extraction face 10A to the incident surface 41 is preferably not less than 0.2 mm and not more than 0.5 mm. Alternatively, the distance from the light extraction face 10A to the incident surface(s) 41 is preferably smaller than the distance from the light-exiting surface(s) 21 to the light extraction face 10A. Disposing the lens members 40 in this manner can suppress each lens member 40 from having a large shape in order to allow divergent light to enter therein.

Regarding the 2D direction, no other component elements are disposed between the light-exiting surface 10A and the incident surface 41. In other words, no straight line that extends from the light-exiting surface 10A in the 2D direction and that passes through the incident surface 41 will pass through any component element. Note that any film (for example, an antireflection coating) that is formed on the light-exiting surface 10A and the incident surface 41 is to be regarded as part of the light-exiting surface 10A and the incident surface 41.

Each lens member 40 is disposed above the photodetector 50 so that its lower face 43 faces the light-receiving surface 52 of the photodetector 50. In a top view, the lens member 40 is disposed so as to overlap the upper face of the photodetector 50 in part or in whole. With such an arrangement, the region of the mounting surface 90M of the second substrate 90 in which the photodetector 50 is disposed at least partially overlaps the region in which the lens member 40 is disposed. This may contribute to reduce the size of the light emitting device 100.

Each of the one or more lens members 40 is disposed so that the incidence-avoiding space 46 opens toward the light-exiting surface 10A. The incidence-avoiding surface 45 is located above the incidence-avoiding space 46, thus defining a boundary surface between the lens member 40 and the incidence-avoiding space 46. The light-receiving surface 52 is located below the incidence-avoiding space 46, thus defining a boundary surface between the photodetector 50 and the incidence-avoiding space 46. In a top view, a whole or a part of the incidence-avoiding surface 45 overlaps a whole or a part of the light-receiving region 53. The incidence-avoiding space 46 is a space interposed between the lens member 40 and the second substrate 90. On an imaginary plane that is parallel to the incident surface 41, an opening 47 that serves as an entrance into the incidence-avoiding space 46 is defined.

The central portion of light emitted from the light extraction face 10A is incident on the incident surface 41. Note that all of the central portion of light may be allowed to be incident on the incident surface 41. A part of the peripheral portion of light emitted from the light extraction face 10A travels through the incidence-avoiding space 46. Within the divergent light emitted from the light extraction face 10A, the light that travels below the optical axis will travel through the incidence-avoiding space 46. The light that is emitted from the light extraction face 10A and that travels through the incidence-avoiding space 46 is incident on and received by the light-receiving region 53. In the illustrated example of the light emitting device 100, this condition is satisfied also when the central portion is defined by a region irradiated with a main portion of light based on a predetermined intensity ratio of $1/e^2$. Because a portion of the light emitted from the light-exiting surface 10A is allowed to travel through the incidence-avoiding space 46 and be incident on the light-receiving surface 52, loss of the light to be received by the light-receiving surface 52 can be reduced.

A straight line along which the incident surface 41 and the incidence-avoiding surface 45 meet is set below an imaginary plane that is parallel to the mounting surface 11M and that includes the light (within the divergent light emitted from the light extraction face 10A) that travels in a direction parallel to the mounting surface 11M. Alternatively, the lower face 43 may be located below the optical axis of divergent light emitted from the light extraction face 10A. Further alternatively, the lower face 43 may be located below the mounting surface 11M. As a result, only the light traveling downward from the light extraction face 10A is allowed to be incident on the opening 47, such that the central portion of light exits through the exiting surface 42.

In the bonding regions 91 provided on the regions on both sides of the recess 99, the lens member 40 is bonded to the second substrate 90. Therefore, strictly speaking, the light-receiving surface 52 and the lower face of the lens member 40 are not in contact, but may have an interspace corresponding to the thickness of the bonding member (see FIG. 4 in particular). However, when identifying the incidence-avoiding space 46 interposed between the lens member 40 and the second substrate 90, this interspace is ignored. In the bonding regions 91, a metal layer 98 may be formed as a bonding layer, for example. Note that the lens member 40 may be bonded to the light-receiving surface 52 of the photodetector 50. More specifically, the entire lower face 43 of the lens member 40 may be bonded to the light-receiving surface 52 of the photodetector 50 via a metal layer or a resin layer. By bonding the lens member 40 to the light-receiving surface 52, accuracy of mounting with respect to the light-receiving surface 52 can be improved.

In a top view, a straight line along which the lower face of the lens member 40 and the incidence-avoiding surface 45 meet extends through the light-receiving surface 52. This straight line is located closer to the exiting surface 42 than is a straight line that passes through a midpoint between the incident surface 41 and the exiting surface 42 along the 2D direction and that runs parallel to the 1D direction. In a top view, the light-receiving region 53 is entirely encompassed within the lens member 40, and a region of the light-receiving region 53 serves as a boundary with the incidence-avoiding space 46. The length of this region accounts for 50% or more of the length of the light-receiving region 53, in the 2D direction. This allows more light to be incident from the incidence-avoiding space 46 on the light-receiving region 53.

In the illustrated example of the light emitting device 100, a plurality of lens members 40 are provided in a one-to-one correspondence with the light-emitting elements 20. The lens members 40 are arranged side by side along the 1D direction. The lens members 40 respectively corresponding to the three light-emitting elements 20 receive light emitted from the corresponding light-emitting element 20 on its incident surface 41, and this light then exits through its exiting surface 42. Note that each lens member 40 does not need to be an independent member; the lens members 40 may be monolithically formed as a single member that possesses the functions of what would otherwise be independent members.

One light-receiving region 53 is irradiated with light that has passed through the incidence-avoiding space 46, within the peripheral portion of light emitted from one light-emitting element 20. Each of the plurality of light-receiving regions 53 is irradiated with light that has passed through the incidence-avoiding space 46, within the peripheral portion of light emitted from a corresponding one of the light-emitting elements 20.

In a top view, the one or more lens members 40 may be disposed so as to overlap the light-receiving surface 52 of the photodetector 50 in part or in whole. In the illustrated example of the light emitting device 100, each lens member 40 is disposed so that a portion thereof overlaps the light-receiving surface 52 of the photodetector 50 in a top view. In a top view, the entirety of the three lens members 40 may overlap the light-receiving surface 52 of the photodetector 50. Furthermore, in a top view, the plurality of light-receiving regions 53 may be encompassed within the one or more lens members 40. With such an arrangement, the light emitting device including a photodetector(s) can be reduced in size. As shown in FIG. 9, each light-receiving region 53 is encompassed within each lens member 40 in a top view, and the three light-receiving regions 53 are encompassed within the entirety of the three lens members 40.

Figure 10B:
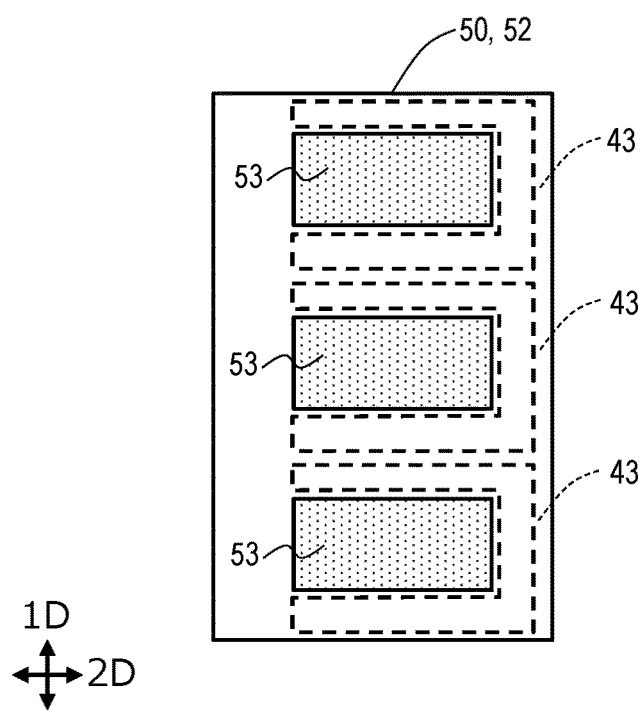
FIG. 10B is still another enlarged top view of the portion X in FIG. 3.

In FIG. 9, FIG. 10A, and FIG. 10B, the outer shape of each U-shaped lower face 43 is indicated with a broken line. Each lens member 40 may be disposed above the photodetector 50, so that its lower face 43 partially overlaps the light-receiving region 53 in a top view. This makes it easier for light passing through the incidence-avoiding space 46 to reach the light-receiving region 53. Alternatively, each lens member 40 may be disposed above the photodetector 50 so that its lower face 43 does not overlap the light-receiving region 53.

As is illustrated in FIG. 10A, the lower face 43 may be disposed so as to partially overlap the light-receiving region 53 in a top view. The lower face 43 of the lens member 40 may be bonded to the light-receiving surface 52 of the photodetector 50 via a resin layer, for example; therefore, the second substrate 90 need not include bonding regions 91. In a top view, the lower face 43 may also partially overlap the mounting surface 90M of the second substrate 90. In a top view, the lower face 43 of each lens member 40 has a U shape, and partially overlaps the light-receiving region 53. In the illustrated example of the light emitting device 100, the lower faces 43 of the three lens members 40 as a whole, partially overlap the three light-receiving regions 53.

Alternatively, as is illustrated in FIG. 10B, the lower face 43 may be disposed so as not to overlap the light-receiving region 53 in a top view. This allows the area ratio of the light-receiving region 53 in the incidence-avoiding space 46 to be improved, thus increasing the amount of received light. The lens member 40 may be bonded to regions of the light-receiving surface 52 other than the light-receiving region 53, via a resin layer, for example.

In the light emitting device 100, the temperature measurement element 60B is disposed on the mounting surface 90M of the second substrate 90. Note that the temperature measurement element 60B may be disposed inside the package 10. The temperature measurement element 60B is mounted on and electrically connected to the pair of wiring regions 95 provided on the mounting surface 90M.

Figure 11:
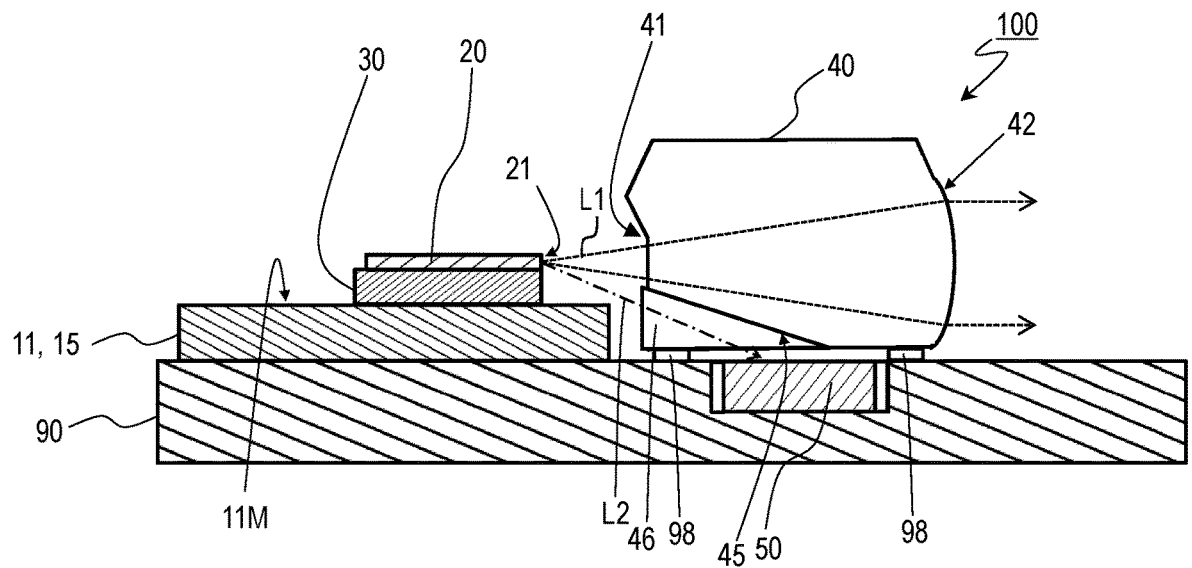
FIG. 11 is a diagram schematically showing how representative rays in main portion of light and peripheral portion of light emitted from a light-emitting element may travel.

FIG. 11 is a diagram schematically showing how representative light beams in the central portion of light L1 and the peripheral portion of light L2 emitted from the light-emitting element 20 may travel. Note that the cap 16 is omitted from illustration in FIG. 11, this being because the light emitting device 100 may be configured so as to lack the cap 16 in some embodiments; neither will the understanding of the optical action in the light emitting device 100 be fatally affected by the presence or absence of the light extraction face 10A. In FIG. 11, the central portion of light L1 is indicated by dotted lines, whereas the peripheral portion of light L2 is indicated by a dot-dash line.

The central (i.e., main) portion of light L1 emitted from the light-exiting surface 21 of the light-emitting element 20 is incident on the incident surface 41 of the lens member 40, and transmitted through the lens member 40 to exit from the exiting surface 42. The light L1 exits from the exiting surface 42 in collimated form.

On the other hand, a part of the peripheral portion of light L2 emitted from the light-emitting element 20 passes through the incidence-avoiding space 46, rather than being incident on the incident surface 41 or the incidence-avoiding surface 45 of the lens member 40, and arrives at the light-receiving region 53 provided on the light-receiving surface 52 of the photodetector 50. Because the emitted light is directly received by the light-receiving region 53 from the incidence-avoiding space 46, losses in the amount of received light can be reduced. A portion of the light emitted from the light-emitting element 20 that travels obliquely downward passes through the incidence-avoiding space 46. A part of the peripheral portion of light L2 that is incident on the light-receiving region 53 preferably has an intensity that is not less than 3% and not more than 10%, and more preferably an intensity that is, for example, not less than 3% and not more than 5%, of an average output of the light emitted from the light-emitting element 20. As a result, a sufficient level of photoelectric conversion element based detection accuracy can be obtained.

The tilt angle of the incidence-avoiding surface 45 provided on each lens member 40 with respect to its lower face 43 may be adjusted in accordance with, for example, the wavelength of incident light or the distance from the light emission point of the corresponding light-emitting element 20 to the light-receiving surface 52 of the photodetector 50 along the thickness direction of the submount 30. Therefore, so long as the plurality of light-emitting elements 20 have different spreads of divergent light along a direction perpendicular to the mounting surface 90, the corresponding incidence-avoiding surfaces 45 may also have respectively different angles. For example, the tilt angle of an incidence-avoiding surface 45 corresponding to light having a greater angle of spread along the fast-axis direction is greater than the tilt angle of an incidence-avoiding surface 45 corresponding to light having a smaller angle of spread along the fast-axis direction. In the illustrated example of the light emitting device 100, red light has a greater angle of spread along the fast-axis direction than that of green or blue light along the fast-axis direction.

Figure 12:
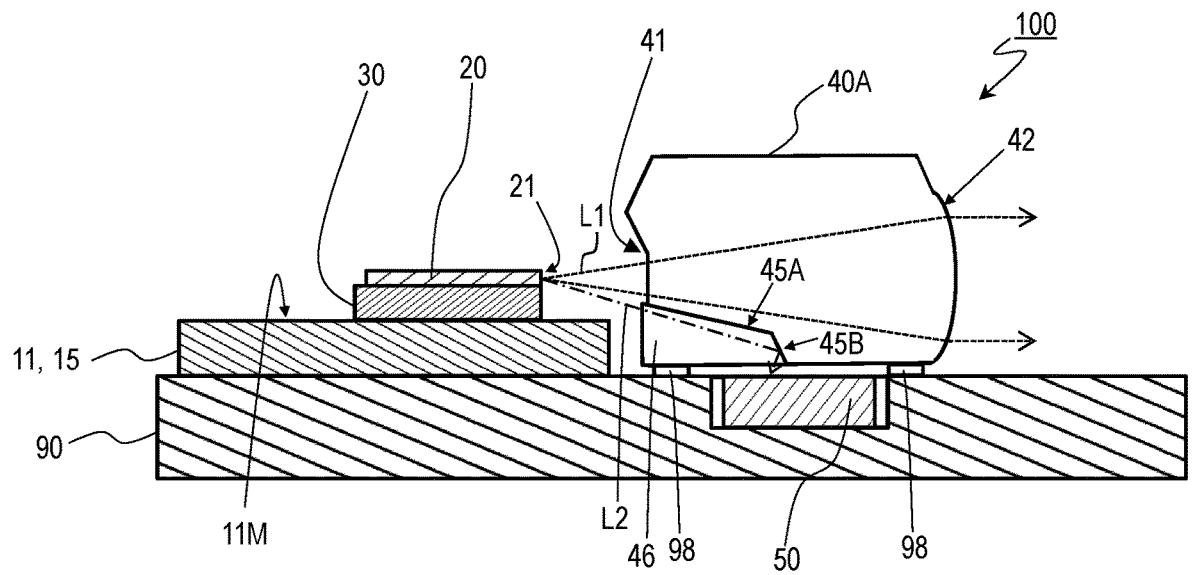
FIG. 12 is a cross-sectional view mainly showing an example structure for a lens member in which multiple inclined surfaces constitute incidence-avoiding surfaces.

FIG. 12 is a cross-sectional view showing an example structure for a lens member 40A, in which a single incidence-avoiding space 46 is defined by a plurality of incidence-avoiding surfaces 45 with different tilt angles. The exemplary lens member 40 shown in FIG. 12 has two incidence-avoiding surfaces 45, which will herein be referred to as the first incidence-avoiding surface 45A and the second incidence-avoiding surface 45B, in order of increasing distance from the incident surface 41. The tilt angle of the first incidence-avoiding surface 45A with respect to the lower face 43 is different from the tilt angle of the second incidence-avoiding surface 45B with respect to the lower face 43. In the illustrated example, the tilt angle of the second incidence-avoiding surface 45B is greater than the tilt angle of the first incidence-avoiding surface 45A. The second incidence-avoiding surface 45B is a reflection surface that has a reflectance of, for example, 99% or more with respect to the peak wavelength of the light traveling through the incidence-avoiding space 46.

A part of the peripheral portion of light L2 incident on the incidence-avoiding space 46 may arrive at the second incidence-avoiding surface 45B. Light reflected by the second incidence-avoiding surface 45B is incident on the light-receiving region 53. Light arriving at the light-receiving region 53 may include light that reaches the light-receiving region 53 without being incident on the incidence-avoiding surface 45 and light that is reflected by the incidence-avoiding surface 45 before reaching the light-receiving region 53. As a result of this, the amount of light received by the light-receiving region 53 can be increased.

The central portion of light L1 emitted from the light-emitting element 20 and a portion of the peripheral portion of light L2 that travels above the optical axis is incident on the incident surface 41, is transmitted through the lens member 40, and exits from the exiting surface 42. Each lens member 40 collimates the light emitted from the corresponding light-emitting element 20.

Figure 13:
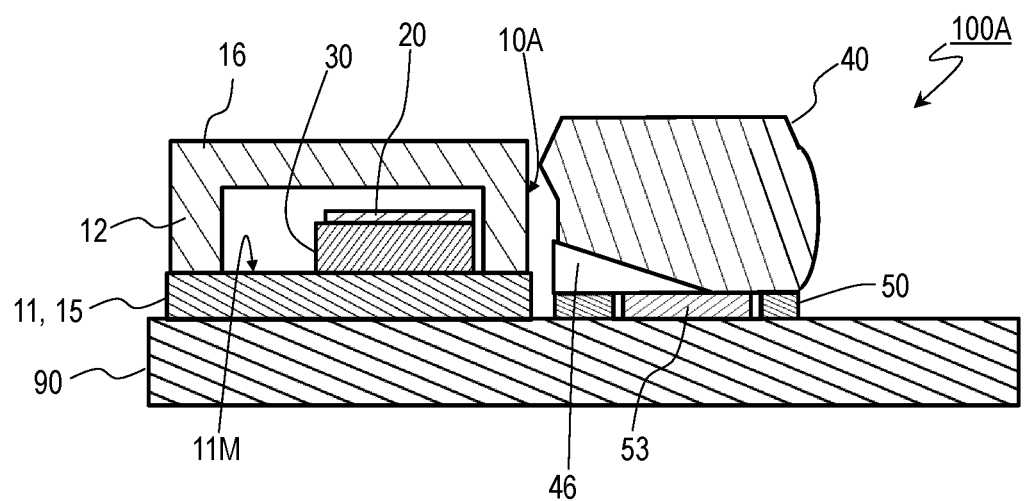
FIG. 13 is a cross-sectional view showing a modified example of a light emitting device according to an embodiment of the present disclosure.

FIG. 13 is a cross-sectional view showing a modified example 100A of the light emitting device 100 according to the present embodiment. The light emitting device 100A according to this modified example differs from the light emitting device 100 in that the photodetector 50 is disposed on the mounting surface 90M of the second substrate 90.

The photodetector 50 may be disposed on the mounting surface 90M of the second substrate 90. Each lens member 40 is bonded to the light-receiving surface 52 of the photodetector 50 via a resin layer, for example. In this case, too, the one or more lens members 40 are disposed so as to overlap the light-receiving surface 52 of the photodetector 50 in part or in whole, and may be disposed so that one light-receiving region 53 is encompassed within one lens member 40 in a top view.

In the light emitting device 100A, no recess needs to be formed in the second substrate 90, and it can be constructed with a flat-plate-shaped second substrate 90, whereby manufacture of the second substrate 90 is facilitated.

Figure 14:
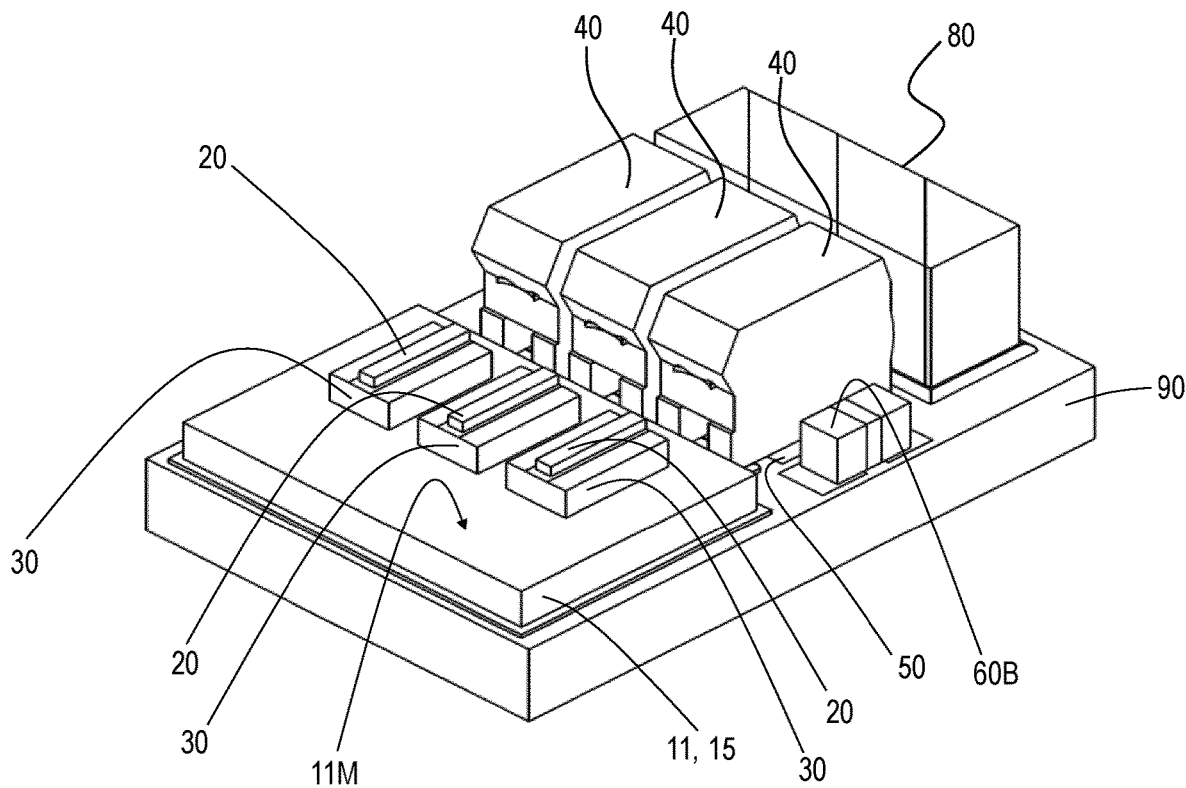
FIG. 14 is a perspective view of the light emitting device according to an embodiment of the present disclosure that further includes a beam combiner, from which a package is partly removed.
Figure 15:
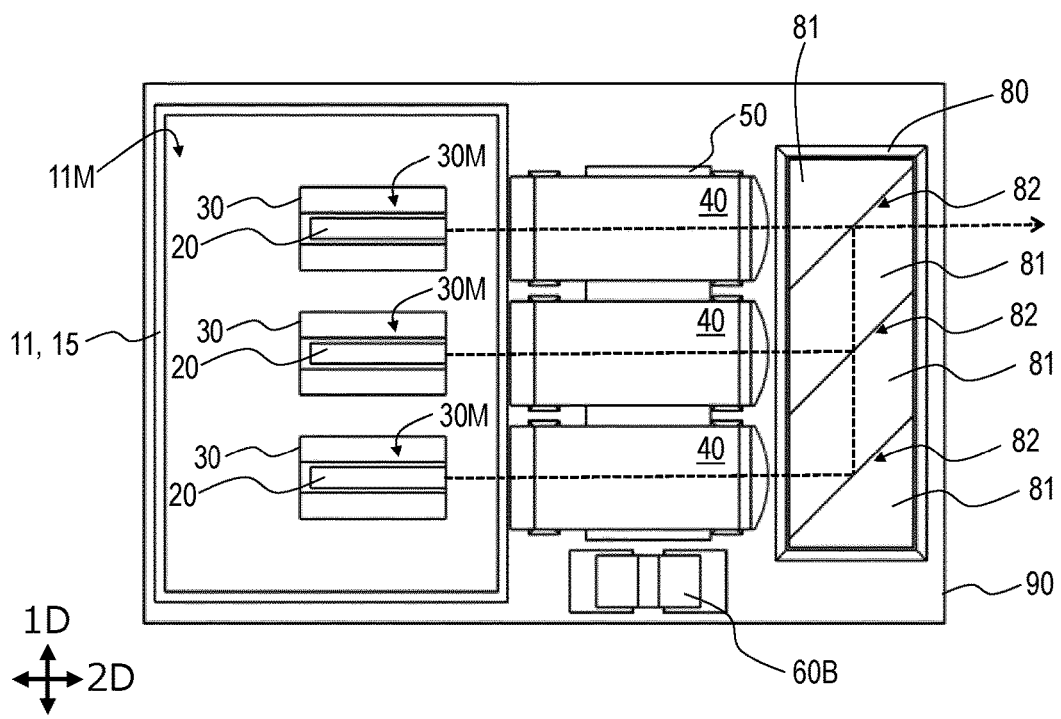
FIG. 15 is a top view of a light emitting device according to an embodiment of the present disclosure that further includes a beam combiner, from which a portion of the package is omitted.

FIG. 14 is a perspective view showing a light emitting device 100 according to an embodiment further including a beam combiner 80, from which a cap 16 is omitted. FIG. 15 is a top view of the light emitting device 100, from which the cap 16 is omitted. In FIG. 15, light traveling on the optical axis, included in the main portion of light that is emitted from each light-emitting element 20, is indicated with a dotted line.

Thus, the light emitting device 100 may further include a beam combiner 80. The beam combiner 80 causes the emitted directions of the collimated light beams to become coaxial, and thus emits combined collimated light. Specifically, the beam combiner 80 causes the emitted directions of collimated light beams that has exited from the exiting surfaces 42 of the lens members 40 (and entered in the 2D direction) to become coaxial, and thus emits combined collimated light in the 2D direction.

The beam combiner 80 is structured so that a plurality of optic elements 81 are bonded together. The optic element 81 may be formed of a transmissive material, for example, glass or plastic, that transmits visible light. The optic element 81 may be implemented by a dichroic mirror, for example. A dichroic mirror is formed of a multilayer dielectric film having a predetermined wavelength selectivity. A multilayer dielectric film may be formed of $Ta_2O_5/SiO_2$, $TiO_2/SiO_2$, $Nb_2O_5/SiO_2$, or the like.

Figure 16:
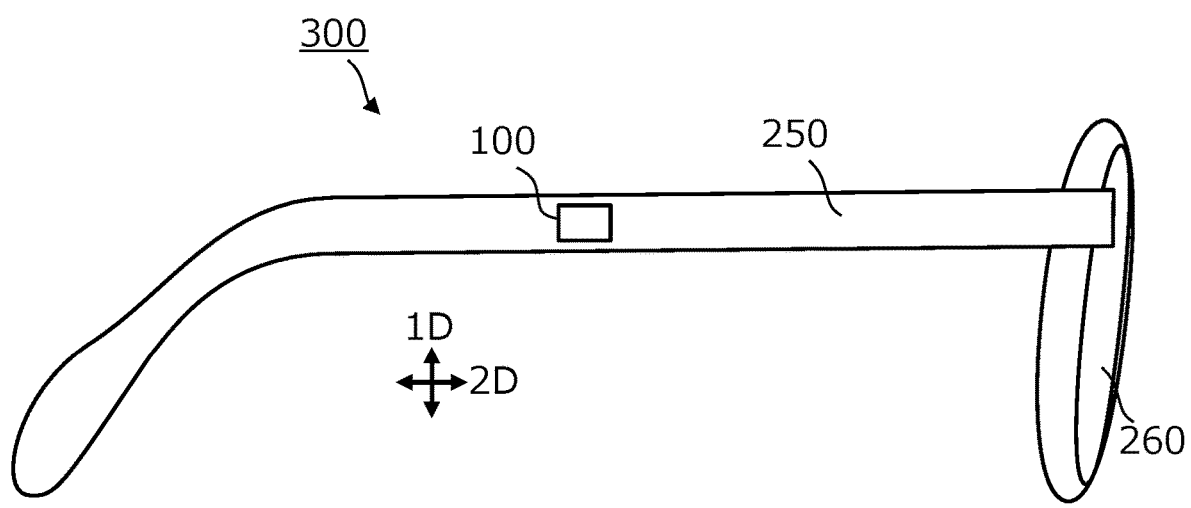
FIG. 16 is a lateral side view schematically showing an example structure of a head-mounted display that includes a light emitting device according to an embodiment of the present disclosure.

FIG. 16 is a lateral side view schematically showing an example structure of a head-mounted display 300 that includes the light emitting device 100 according to an embodiment of the present disclosure. The head-mounted display 300 includes temples 250 and viewing field sections 260. The viewing field sections 260 are located in front of the eyes of a user wearing the head-mounted display 300. The viewing field sections 260 can be used as display sections for displaying screen images. Moreover, the viewing field sections 260 can be used as lenses of a pair of glasses, for example. Light emitted from the light emitting device 100 is used in presenting screen images to be displayed to the user.

The light emitting device 100 is disposed at a temple 250. The light emitting device 100 is mounted on the inner side of the temple 250. Although FIG. 16 illustrates the light emitting device 100 as if visible on a lateral face, actually the outer look of the light emitting device 100 is not to be visually recognized from the outside. The length of the light emitting device 100 along the 2D direction, in which light is emitted, is greater than its length along the 1D direction. The size of the light emitting device along the 1D direction is preferably not less than 7 mm and not more than 10 mm, for example. Decreasing the size of the light emitting device 100 along the 1D direction may allow the width of the temple along the 1D direction to be reduced.

Certain embodiments of the present invention have been described above, but light emitting devices according to the present invention are not limited to those described in the embodiments. In other words, the present invention is achievable without being limited to the outer shapes or structures of the light emitting devices disclosed in the embodiments. For example, a light emitting device according to the present invention can be one that has no protective device. The present invention is applicable without necessarily and fully including all of the disclosed constituent elements. For example, in the event that a certain component of a light emitting device included in any of the disclosed embodiments is not recited in the claims, the claimed invention may still be applicable in view of the design flexibility of a person of ordinary skill in the art for such a component through the use of an alternative, an omission, a shape change, a change in the materials employed, or the like.

Light emitting devices according to embodiments can be used for head-mounted displays, projectors, lighting apparatuses, displays, and the like.

What is claimed is:

1. A light emitting device comprising:
   a first light-emitting element;
   a second light-emitting element;
   a photodetector having a light-receiving surface at an upper face thereof, the light-receiving surface comprising:
      a first light-receiving region configured to receive a portion of light emitted from the first light-emitting element, and
      a second light-receiving region configured to receive a portion of light emitted from the second light-emitting element; and
   at least one lens member having:
      at least one lower face,
      at least one incident surface on which a portion of the light emitted from the first light-emitting element and/or a portion of the light emitted from the second light-emitting element are incident, and
      at least one lateral face extending upward from the at least one lower face, the at least one lateral face including at least one exiting surface through which the portion of the light incident on the at least one incident surface is emitted;
   wherein, in a top view, the at least one lens member overlaps the upper face of the photodetector in part or in whole.

2. The light emitting device of claim 1, wherein, in the top view, the first light-receiving region and the second light-receiving region are encompassed within the at least one lens member.

3. The light emitting device of claim 1, wherein the at least one lens member is bonded to the upper face of the photodetector.

4. The light emitting device of claim 3, wherein the at least one lens member is bonded to the upper face of the photodetector via a metal layer or a resin layer.

5. The light emitting device of claim 1, wherein:
   the at least one lens member comprises a first lens member configured to receive light emitted at least from the first light-emitting element, wherein the first lens member has at least one incidence-avoiding surface, the at least one incidence-avoiding surface being formed on an exiting surface side relative to the incident surface and being formed above the lower face; and
   a portion of light emitted from the first light-emitting element passes through an incidence-avoiding space and reaches the first light-receiving region without being incident on the incident surface of the first lens member and without being incident on the at least one incidence-avoiding surface, wherein the incidence-avoiding space is a space surrounded by a first plane that includes and is parallel to the incident surface, a second plane that includes and is parallel to the lower face, and the at least one incidence-avoiding surface.

6. The light emitting device of claim 5, wherein:
   the at least one incidence-avoiding surface comprises one incidence-avoiding surface formed so as to meet the incident surface, continue from the incident surface, and be oblique with respect to the incident surface;
   the incidence-avoiding space is a space surrounded by the first plane, the second plane, and a third plane that includes and is parallel to the incidence-avoiding surface; and
   a portion of light emitted from the first light-emitting element that travels obliquely downward passes through the incidence-avoiding space and reaches the first light-receiving region without being incident on the first lens member.

7. The light emitting device of claim 6, wherein light reflected by the incidence-avoiding surface reaches the first light-receiving region.

8. The light emitting device of claim 5, wherein:
   the lower face of the first lens member is bonded to the upper face of the photodetector; and
   in the top view, the lower face partially overlaps the first light-receiving region and the second light-receiving region.

9. The light emitting device of claim 5, wherein:
   the lower face of the first lens member is bonded to the upper face of the photodetector; and
   in the top view, the lower face overlaps neither the first light-receiving region nor the second light-receiving region.

10. The light emitting device of claim 5, wherein:
    the first light-emitting element is a semiconductor laser element;
    a portion of the light emitted from the first light-emitting element having a peak optical intensity of 1/e2 or more is incident on the incident surface of the first lens member; and
    a portion of the light emitted from the first light-emitting element having a peak optical intensity less than 1/e2 passes through the incidence-avoiding space and is incident on the first light-receiving region.

11. The light emitting device of claim 1, further comprising:
    a package having a light extraction face that includes a light-transmissive region, wherein:
    a closed space is formed inside the package;
    the first light-emitting element and the second light-emitting element are disposed inside the package; and
    the at least one lens member and the photodetector are disposed outside the package.

12. The light emitting device of claim 1, further comprising:
    a third light-emitting element, wherein:
    the light-receiving surface of the photodetector further comprises a third light-receiving region configured to receive a portion of light emitted from the third light-emitting element;
    a portion of light emitted from the third light-emitting element is incident on the at least one incident surface of the at least one lens member, and the portion of the light incident on the at least one incident surface exits from the at least one exiting surface; and
    the first light-emitting element is configured to emit red light, the second light-emitting element is configured to emit green light, and the third light-emitting element is configured to emit blue light.

13. The light emitting device of claim 12, wherein the at least one lens member is configured to collimate light emitted from the first light-emitting element, the second light-emitting element, and the third light-emitting element.

14. The light emitting device of claim 1, wherein:
the at least one lens member comprises a second lens member configured to receive light emitted at least from the second light-emitting element, wherein the second lens member has at least one incidence-avoiding surface, the at least one incidence-avoiding surface being formed on an exiting surface side relative to the incident surface and being formed above the lower face; and
a portion of light emitted from the second light-emitting element passes through an incidence-avoiding space and reaches the second light-receiving region without being incident on the incident surface of the second lens member and without being incident on the at least one incidence-avoiding surface, wherein the incidence-avoiding space is a space surrounded by a first plane that includes and is parallel to the incident surface, a second plane that includes and is parallel to the lower face, and the at least one incidence-avoiding surface.

15. A light emitting device comprising:
a first light-emitting element;
a second light-emitting element;
a photodetector having a light-receiving surface at an upper face thereof, the light-receiving surface comprising:
  a first light-receiving region configured to receive a portion of light emitted from the first light-emitting element, and
  a second light-receiving region configured to receive a portion of light emitted from the second light-emitting element; and
at least one lens member having:
  at least one incident surface on which a portion of the light emitted from the first light-emitting element and/or a portion of the light emitted from the second light-emitting element are incident, and
  at least one exiting surface through which the portion of the light incident on the at least one incident surface is emitted;
wherein, in a top view, the at least one lens member overlaps the upper face of the photodetector in part or in whole, and
a first optical axis of the light emitted from the first light-emitting element extends parallel to the first light-receiving region and a second optical axis of the light emitted from the second light-emitting element extends parallel to the second light-receiving region.

16. A light emitting device comprising:
a first light-emitting element;
a second light-emitting element;
a photodetector having a light-receiving surface at an upper face thereof, the light-receiving surface comprising:
  a first light-receiving region configured to receive a portion of light emitted from the first light-emitting element, and
  a second light-receiving region configured to receive a portion of light emitted from the second light-emitting element; and
at least one lens member having:
  at least one incident surface on which a portion of the light emitted from the first light-emitting element and/or a portion of the light emitted from the second light-emitting element are incident, and
  at least one exiting surface through which the portion of the light incident on the at least one incident surface is emitted;
wherein, in a top view, the at least one lens member overlaps the upper face of the photodetector in part or in whole, and
the light emitted from the at least one exiting surface includes light that enters neither the first light-receiving region nor the second light-receiving region.

\* \* \* \* \*